US010438536B2

(12) United States Patent
Gao et al.

(10) Patent No.: US 10,438,536 B2
(45) Date of Patent: Oct. 8, 2019

(54) ELECTROLUMINESCENT DISPLAY PANEL, DISPLAY DEVICE AND METHOD FOR DRIVING THE SAME

(71) Applicant: Shanghai Tianma AM-OLED Co., Ltd., Shanghai (CN)

(72) Inventors: Yana Gao, Shanghai (CN); Dongxu Xiang, Shanghai (CN); Renyuan Zhu, Shanghai (CN); Yue Li, Shanghai (CN); Zeyuan Chen, Shanghai (CN); Zhonglan Cai, Shanghai (CN)

(73) Assignee: SHANGHAI TIANMA AM-OLED CO., LTD., Shanghai, P.R. (CN)

( * ) Notice: Subject to any disclaimer, the term of this patent is extended or adjusted under 35 U.S.C. 154(b) by 0 days.

(21) Appl. No.: 15/866,235

(22) Filed: Jan. 9, 2018

(65) Prior Publication Data

US 2018/0130420 A1 May 10, 2018

(30) Foreign Application Priority Data

Jul. 31, 2017 (CN) .......................... 2017 1 0642948

(51) Int. Cl.
*G09G 3/3258* (2016.01)
*H01L 51/52* (2006.01)
*G09G 3/3233* (2016.01)

(52) U.S. Cl.
CPC ......... *G09G 3/3258* (2013.01); *G09G 3/3233* (2013.01); *H01L 51/5206* (2013.01); *G09G 2300/0814* (2013.01); *G09G 2300/0819* (2013.01); *G09G 2310/0264* (2013.01); *G09G 2320/0233* (2013.01)

(58) Field of Classification Search
CPC ............... G09G 3/3258; G09G 3/3233; G09G 2320/0233; G09G 2320/043; G09G 2320/0257
See application file for complete search history.

(56) References Cited

U.S. PATENT DOCUMENTS

| | | | | |
|---|---|---|---|---|
| 2015/0379930 A1* | 12/2015 | Lee | G09G 3/3233 | 345/76 |
| 2017/0076646 A1 | 3/2017 | Gu et al. | | |
| 2017/0270860 A1* | 9/2017 | Wang | G09G 3/3233 | |

FOREIGN PATENT DOCUMENTS

| | | | |
|---|---|---|---|
| CN | 1577458 | A | 2/2005 |
| CN | 105448241 | A | 3/2016 |
| CN | 105528992 | A | 4/2016 |
| CN | 105679249 | A | 6/2016 |
| CN | 106558287 | A | 4/2017 |
| CN | 106710529 | A | 5/2017 |
| CN | 106940978 | A | 7/2017 |

* cited by examiner

*Primary Examiner* — Koosha Sharifi-Tafreshi
(74) *Attorney, Agent, or Firm* — Alston & Bird LLP

(57) ABSTRACT

The present disclosure discloses an electroluminescent display panel, a display device and a method for driving the same. The electroluminescent display panel includes a plurality of pixel circuits arranged in an array, wherein the plurality of pixel circuits each includes a node initialization module and an anode reset module; wherein a connection passage is arranged between every two adjacent pixel circuits of each column of the plurality of pixel circuits; and the connection passage is configured to provide a reference signal to either an anode reset module or a node initialization module of one of the every two adjacent pixel circuits.

16 Claims, 18 Drawing Sheets

--Prior Art--

--Prior Art--

ELECTROLUMINESCENT DISPLAY PANEL, DISPLAY DEVICE AND METHOD FOR DRIVING THE SAME

CROSS-REFERENCE TO RELATED APPLICATION

This Application claims priority to Chinese Patent Application No. CN201710642948.0, filed on Jul. 31, 2017, the content of which is incorporated by reference in the entirety.

FIELD

The present disclosure relates to the field of display technologies, and particularly to an electroluminescent display panel, a display device and a method for driving the same.

DESCRIPTION OF THE RELATED ART

Having advantages like fast response speed, wide color gamut, wide angle of view, high brightness and light weight, etc., organic light emitting diode (OLED) displays have attracted much attention, and have been widely used in the field of light emitting technologies. However, since the OLED display is a display driven by current, stable current is needed to drive the display to emit light. Because of process factors, device ageing, etc. OLEDS are prone to instability from drifts of threshold voltage (Vth) of a drive transistor of a pixel circuit, thereby causing non-uniform display and an afterimage.

To solve this problem, people have applied a pixel circuit with a compensation function in general, to compensate for the threshold voltage; for example, a pixel circuit as illustrated in FIG. 1 includes six switch transistors T1 to T6, one drive transistor Md and one capacitor C; and a corresponding input time sequence diagram is as illustrated in FIG. 2. Although internal compensation in the pixel circuit alleviates the problem of non-uniform display arising from drifting of threshold voltage of the drive transistor due to the process factor, and aging of the transistor, there is inconsistent brightness of the first frame after the image is switched between high and low grayscales. Furthermore, after the pixel circuit emits light for a period of time, the threshold voltage of the drive transistor may deviate due to a bias stress that results in an afterimage.

SUMMARY

Embodiments of the present disclosure provide an electroluminescent display panel, a display device, and a method for driving the same.

An embodiment of the present disclosure provides an electroluminescent display panel, including a plurality of pixel circuits arranged in an array, wherein the plurality of pixel circuits each includes a node initialization module and an anode reset module; wherein a connection passage is arranged between every two adjacent pixel circuits of each column of the plurality of pixel circuits; and wherein the connection passage is configured to provide a reference signal to either an anode reset module or a node initialization module of one of the every two adjacent pixel circuits.

In another aspect, an embodiment of the present disclosure further provides a display device, including the electroluminescent display panel above according to the embodiment of the present disclosure.

In still another aspect, an embodiment of the present disclosure further provides a method for driving the electroluminescent display panel above according to the embodiment of the present disclosure, including: providing, by the connection passage, the node initialization module of the one of the every two adjacent pixel circuits with the reference signal, in an initialization stage of the one of the every two adjacent pixel circuits; or, providing, by the connection passage, the anode reset module of the one of the every two adjacent pixel circuits with the reference signal, in a data writing stage of the one of the every two adjacent pixel circuits.

DETAILED DESCRIPTION OF THE EMBODIMENTS

The particular embodiments of the electroluminescent display panel, the display device and the method for driving the same according to the embodiments of the disclosure will be described below in details with reference to the drawings. It shall be noted that the embodiments described below are only a part but not all of the embodiments of the disclosure. Based upon the embodiments here of the disclosure, all the other embodiments which can occur to those skilled in the art without any inventive effort shall fall into the scope of the disclosure.

Figure 1:
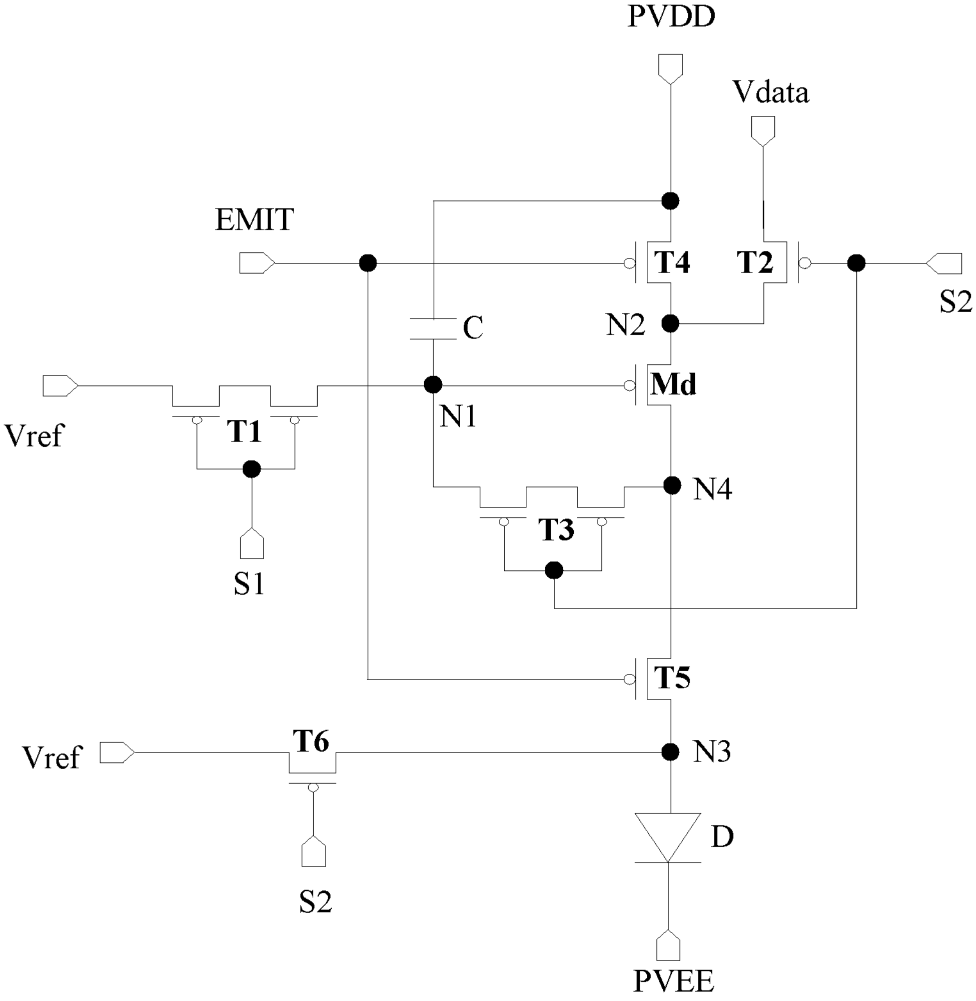
FIG. 1 is a schematic circuit diagram of a pixel circuit in the related art.
Figure 2:
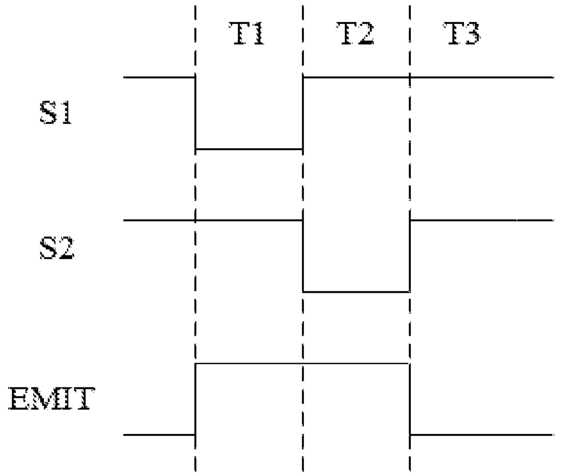
FIG. 2 is a corresponding input-output time sequence diagram of the pixel circuit in the related art.

As a result of a simulation on the pixel circuit illustrated in FIG. 1, when the (n−1)-th frame is at the grayscale 0, the n-th frame is at the grayscale 255, and the (n+1)-th frame is at the grayscale 255, potentials of a first node N1 and a second node N2 in different periods of time are detected as depicted in Table 1 below.

TABLE 1

| Grayscale | 0 | | 255 | | 255 | |
|---|---|---|---|---|---|---|
| Frame No. | (n − 1)-th frame | n-th frame | | | (n + 1)-th frame | |
| Stage | Light emitting Stage | Initialization Stage | Data writing Stage | Light emitting Stage | Initialization Stage | Data writing Stage |
| N1 | 3.44 | −3 | 1.03 | 1.5 | −3 | 1.02 |
| N2 | 4.6 | −0.65 | 3.5 | 4.6 | 0.15 | 3.5 |

As can be apparent from Table 1 above, the potential of the second node N2 in the n-th frame is different from the potential of the second node N2 in the (n+1)-th frame in the initialization stage. This is because the first node N1 is switched to the potential −3V in the n-th frame from 3.44V, and the first node N1 is switched to the potential −3V in the (n+1)-th frame from 1.5V, in the initialization stage. And there is a parasitic capacitance between the first node N1 and the second node N2 in the pixel circuit, and the second node N2 is floating in the initialization stage. Therefore there is such a different change in voltage ΔV of the first node N1 that the potential of the second node N2 in the n-th frame is different from the potential of the second node N2 in the (n+1)-th frame in the initialization stage, so that the potential of the first node N1 in the n-th frame is different from the potential of the first node N1 in the (n+1)-th frame in the data writing stage, thus resulting in such a problem that the brightness of the n-th frame is different from the brightness of the (n+1)-th frame.

In view of this, an embodiment of the disclosure provides an electroluminescent display panel. By resetting the potentials of both the first node N1 and the second node N2 in the initialization stage, the problem of different brightness arising from their difference in potential due to the parasitic capacitance between them is avoided. Moreover, by arranging a connection passage between every two adjacent pixel circuits of each column of the plurality of pixel circuits, a reference signal is provided for an adjacent pixel circuit, so that the number of signal ports can be reduced and the wiring space can be saved.

Figure 3:
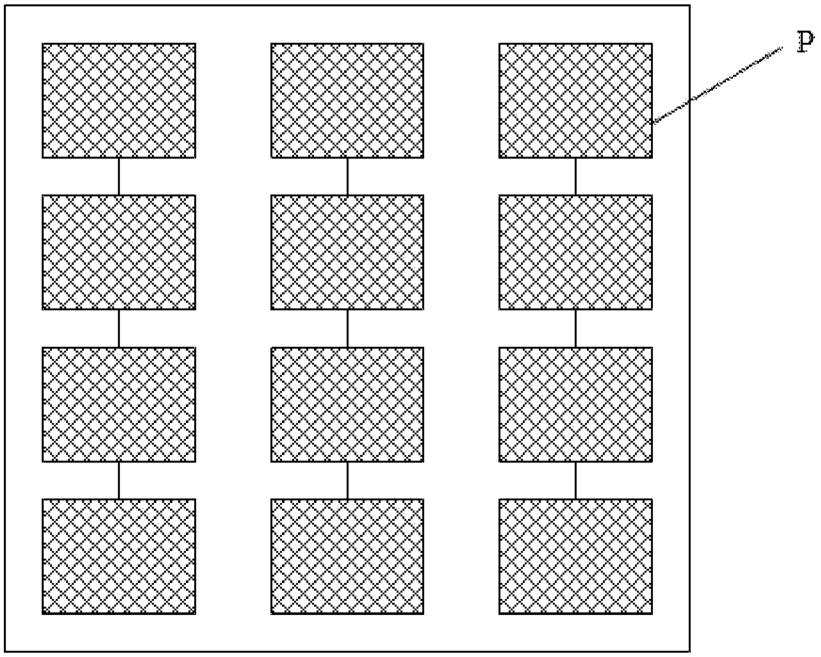
FIG. 3 is a schematic structural diagram of an electroluminescent display panel according to an embodiment of the disclosure.

In one or more embodiments, the electroluminescent display panel according to the embodiment of the disclosure, as illustrated in FIG. 3, can include a plurality of pixel circuits P arranged in an array, each pixel circuit P includes a node initialization module 101 and an anode reset module 102; wherein, as illustrated in FIG. 4 to FIG. 7, a connection passage is arranged between every two adjacent pixel circuits of each column of the plurality of pixel circuits, the connection passage is configured to provide a reference signal to either an anode reset module 102 or a node initialization module 101 of one of the every two adjacent pixel circuits.

In the electroluminescent display panel above according to the embodiment of the disclosure, by arranging a connection passage between every two adjacent pixel circuits of each column of the plurality of pixel circuits, not only key nodes can be initialized via a node initialization module, thereby avoiding the problem of threshold voltage being differently grabbed due to a voltage jump and effectively preventing the afterimage from occurring as a result of the deviating threshold voltage of the drive transistor, but also a reference signal can be provided for either an anode reset module 102 or a node initialization module 101 of an adjacent pixel circuit, thereby reducing the number of signal ports and saving wiring space.

In a particular implementation, in the electroluminescent display panel above according to the embodiment of the disclosure, as illustrated in FIG. 4 to FIG. 7 which illustrate some pixel circuits as illustrated in FIG. 3, a node initialization module 101 of each pixel circuit includes a first terminal electrically connected with a first scan signal terminal of the each pixel circuit, a second terminal electrically connected with a reference signal terminal Vref of the each pixel circuit, a third terminal electrically connected with a first node N1 of the each pixel circuit, a fourth terminal electrically connected with a second node N2 of the each pixel circuit, and a fifth terminal used for receiving a reference signal; and the node initialization module 101 is configured to be controlled by a first scan signal input from the first scan signal terminal of the each pixel circuit to transmit a reference signal input from the reference signal terminal Vref of the each pixel circuit to the first node N1 of the each pixel circuit, and to transmit the reference signal received by the fifth terminal of the node initialization module 101 to the second node N2 of the each pixel circuit.

An anode reset module 102 of the each pixel circuit includes a first terminal electrically connected with a second scan signal terminal of the each pixel circuit, a second terminal electrically connected with a third node N3 of the each pixel circuit, and a third terminal used for receiving a reference signal; and the anode reset module 102 is configured to be controlled by a second scan signal input from the second scan signal terminal of the each pixel circuit to transmit the reference signal received by the third terminal of the anode reset module 102 to the third node N3 of the each pixel circuit.

The connection passage is configured to provide a reference signal to a third terminal of the anode reset module 102 or a fifth terminal of the node initialization module 101 of the one of the every two adjacent pixel circuits.

In a particular implementation, as illustrated in FIG. 4 to FIG. 7, in the electroluminescent display panel above according to the embodiment of the disclosure, each pixel circuit not only includes a node initialization module 101 and an anode reset module 102, but can also include: a data writing module 103, a light emitting control module 104, a drive control module 105 and a light emitting diode 106 (which can be an organic light emitting diode). Since each pixel circuit includes the six modules above, the connection relationship between the modules will be explained below by taking the structure of the pixel circuit P1 (i.e. a first pixel circuit of a column of pixel circuits) illustrated in FIG. 4 and FIG. 5 as an example.

A data writing module 103 of the pixel circuit P1 includes a first terminal electrically connected with a second scan signal terminal S2 of the pixel circuit P1, a second terminal electrically connected with a data signal terminal Vdata of the pixel circuit P1, a third terminal electrically connected with a second node N2 of the pixel circuit P1, a fourth terminal electrically connected with a first node N1 of the pixel circuit P1, and a fifth terminal electrically connected with a fourth node N4 of the pixel circuit P1; and the data writing module 103 of the pixel circuit P1 is configured to be controlled by a second scan signal input from the second scan signal terminal S2 of the pixel circuit P1 to transmit a data signal input from the data signal terminal Vdata of the pixel circuit P1 to the second node N2 of the pixel circuit P1, and to provide an electric potential at the fourth node N4 of the pixel circuit P1 to the first node N1 of the pixel circuit P1.

A light emitting control module 104 of the pixel circuit P1 includes a first terminal electrically connected with a light emitting control signal terminal EMIT1 of the pixel circuit P1, a second terminal electrically connected with a first voltage signal terminal PVDD of the pixel circuit P1, a third terminal electrically connected with the second node N2 of the pixel circuit P1, a fourth terminal electrically connected with the fourth node N4 of the pixel circuit P1, and a fifth terminal electrically connected with a third node N3 of the pixel circuit P1; and the light emitting control module 104 of the pixel circuit P1 is configured to be controlled by a light emitting control signal input from the light emitting control signal terminal EMIT1 of the pixel circuit P1 to transmit a first voltage signal input from the first voltage signal terminal PVDD of the pixel circuit P1 to the second node N2 of the pixel circuit P1, and to provide the electric potential at the fourth node N4 of the pixel circuit P1 to the third node N3 of the pixel circuit P1.

A drive control module 105 of the pixel circuit P1 includes a first terminal electrically connected with the first node N1 of the pixel circuit P1, a second terminal electrically connected with the first voltage signal terminal PVDD of the pixel circuit P1, a third terminal electrically connected with the second node N2 of the pixel circuit P1, and a fourth terminal electrically connected with the fourth node N4 of the pixel circuit P1; and the drive control module 105 of the pixel circuit P1 is configured to be controlled by the first voltage signal input from the first voltage signal terminal PVDD of the pixel circuit P1 to maintain an electric potential at the first node N1 of the pixel circuit P1, and to be controlled by the first node N1 of the pixel circuit P1 to connect the second node N2 of the pixel circuit P1 with the fourth node N4 of the pixel circuit P1.

A light emitting diode 106 of the pixel circuit P1 includes a first terminal electrically connected with the third node N3 of the pixel circuit P1, and a second terminal electrically connected with a second voltage signal terminal PVEE of the pixel circuit P1.

In one or more embodiments, a structure of a pixel circuit in the electroluminescent display panel illustrated in FIG. 4 to FIG. 7 is taken as an example, by conducting a simulation on a pixel circuit, when the (n−1)-th frame is at the grayscale 0, the n-th frame is at the grayscale 255, and the (n+1)-th frame is at the grayscale 255, potentials of the first node N1 and the second node N2 in different periods of time are detected as depicted in Table 2 below.

TABLE 2

| Gray Scale | 0 | 255 | | | 255 | |
|---|---|---|---|---|---|---|
| Frame No. | (n − 1)-th frame | n-th frame | | | (n + 1)-th frame | |
| Stage | Light emitting Stage | Initialization Stage | Data writing Stage | Light emitting Stage | Initialization Stage | Data writing Stage |
| N1 | 3.44 | −3 | 1.03 | 1.5 | −3 | 1.03 |
| N2 | 4.6 | −0.58 | 3.5 | 4.6 | −0.59 | 3.5 |

As apparent from Table 2 above, the potential of the second node N2 in the n-th frame is substantially the same as the potential of the second node N2 in the (n+1)-th frame in the initialization stage. The first node N1 is switched to the potential −3V in the n-th frame from 3.44V, and the first node N1 is switched to the potential −3V in the (n+1)-th frame from 1.5V, in the initialization stage. And although there is a parasitic capacitance between the first node N1 and the second node N2 in the pixel circuit, the potentials of the second node n2 are reset to −0.58V and −0.59V by the reference signal in the initialization stage. Therefore, the change in voltage ΔV of the first node N1 will not have any influence upon the potential of the second node N2 in the n-th frame, and the potential of the second node N2 in the (n+1)-th frame in the initialization stage, and thus will not have any influence upon the potential of the first node N1 in the n-th frame, and the potential of the first node N1 in the (n+1)-th frame in the data writing stage, so that the brightness of the n-th frame will be the same as the brightness of the (n+1)-th frame.

In a particular implementation, in the electroluminescent display panel above according to the embodiment of the disclosure, the connection passage arranged between the every two adjacent pixel circuits of the each column of the plurality of pixel circuits may have the following several implementations.

Figure 4:
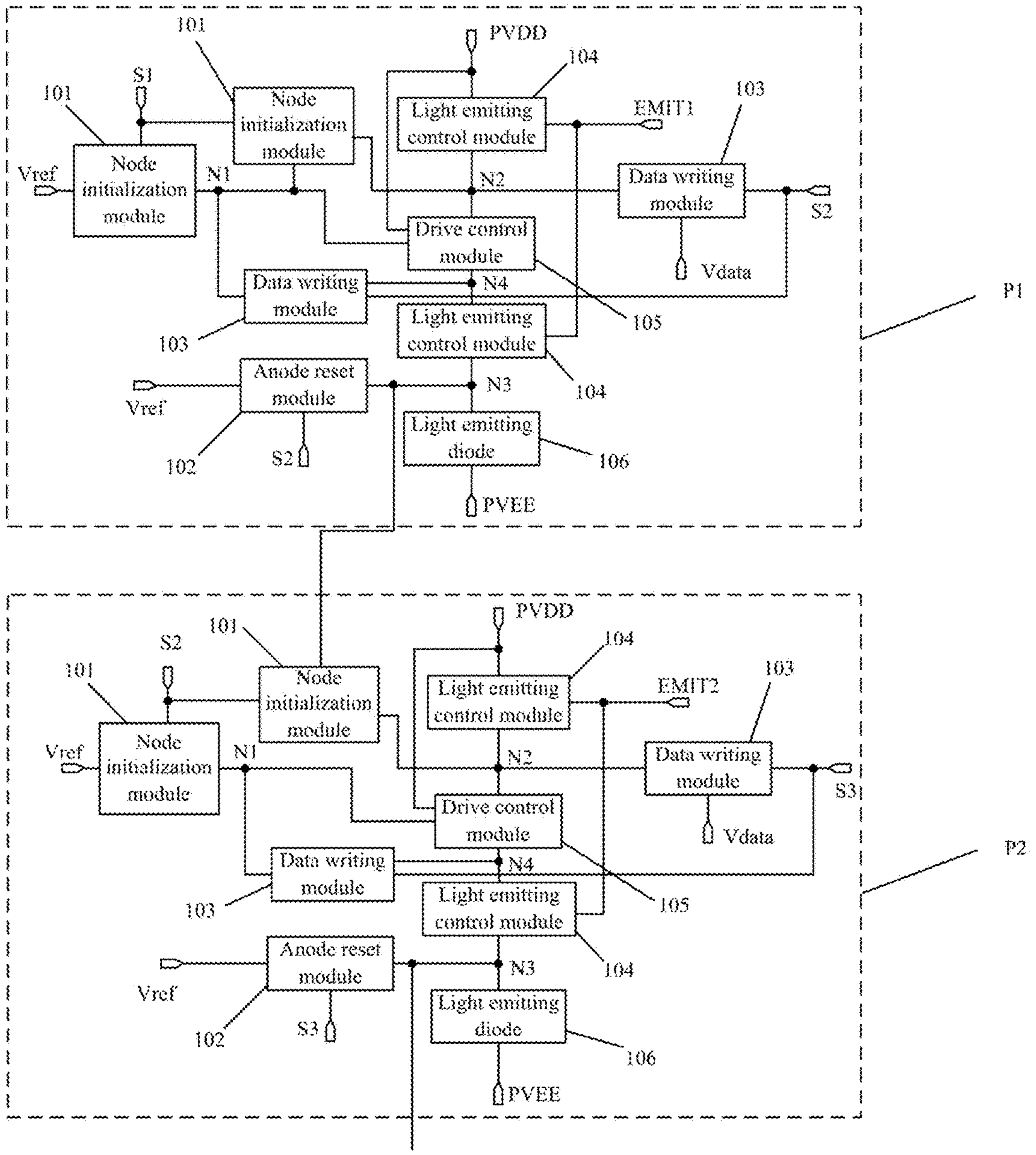
FIGS. 4-14 are schematic structural diagrams of pixel circuits according to various embodiments of the disclosure respectively.
Figure 5:
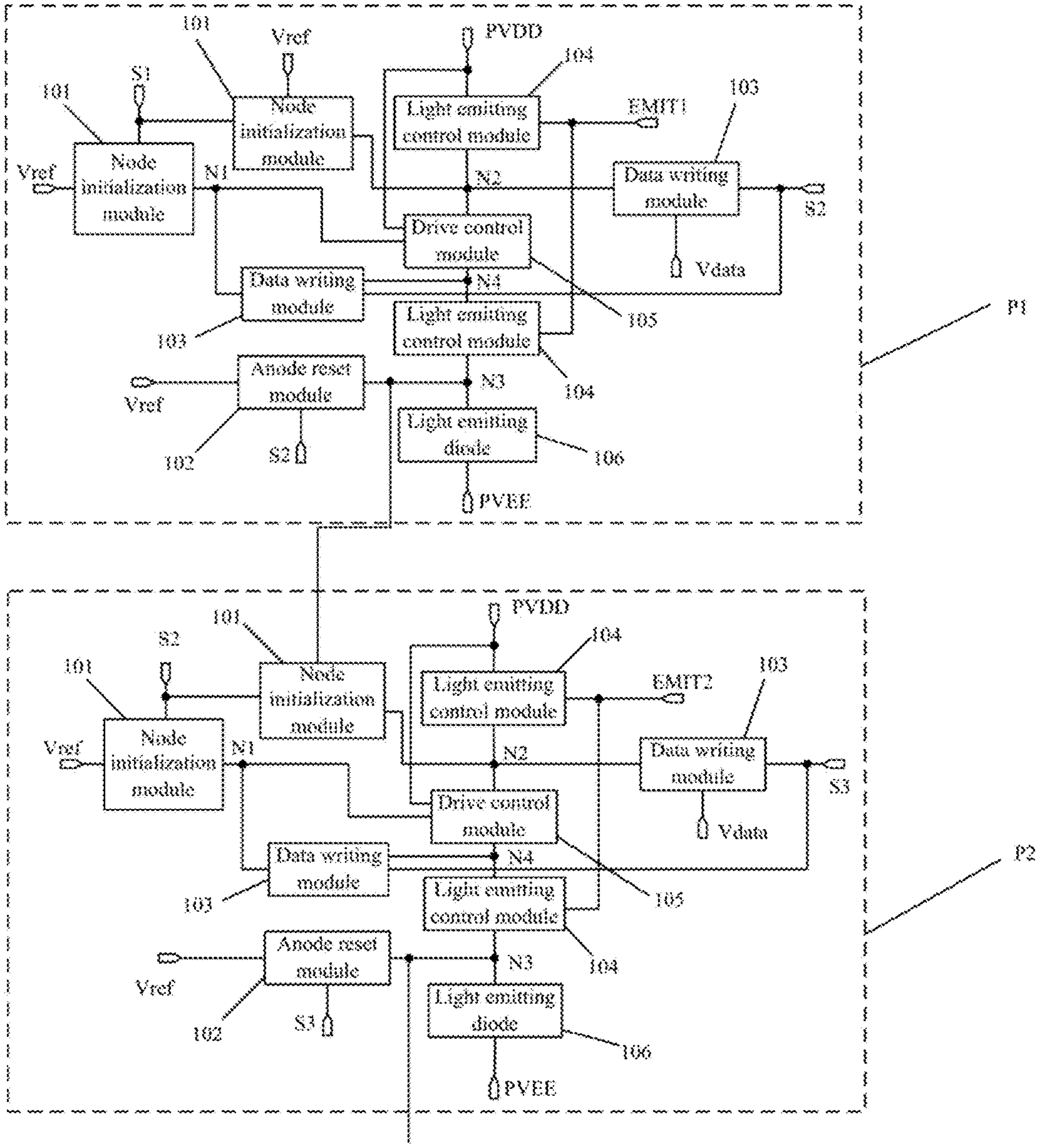

A first implementation: the connection passage provides a reference signal to a fifth terminal of a node initialization module 101 of a latter pixel circuit of the every two adjacent pixel circuits, so that a second node N2 of the latter pixel circuit is initialized while initializing a first node N1 of the latter pixel circuit in the initialization stage; as illustrated in FIG. 4 and FIG. 5, the dotted frame 1 represents a first pixel circuit of a column of pixel circuits, which is called pixel circuit P1, the dotted frame 2 represents a second pixel circuit adjacent to the first pixel circuit of the column of pixel circuits, which is called pixel circuit P2, and the connection passage between them provides a reference signal to a fifth terminal of a node initialization module 101 of the pixel circuit P2.

Figure 6:
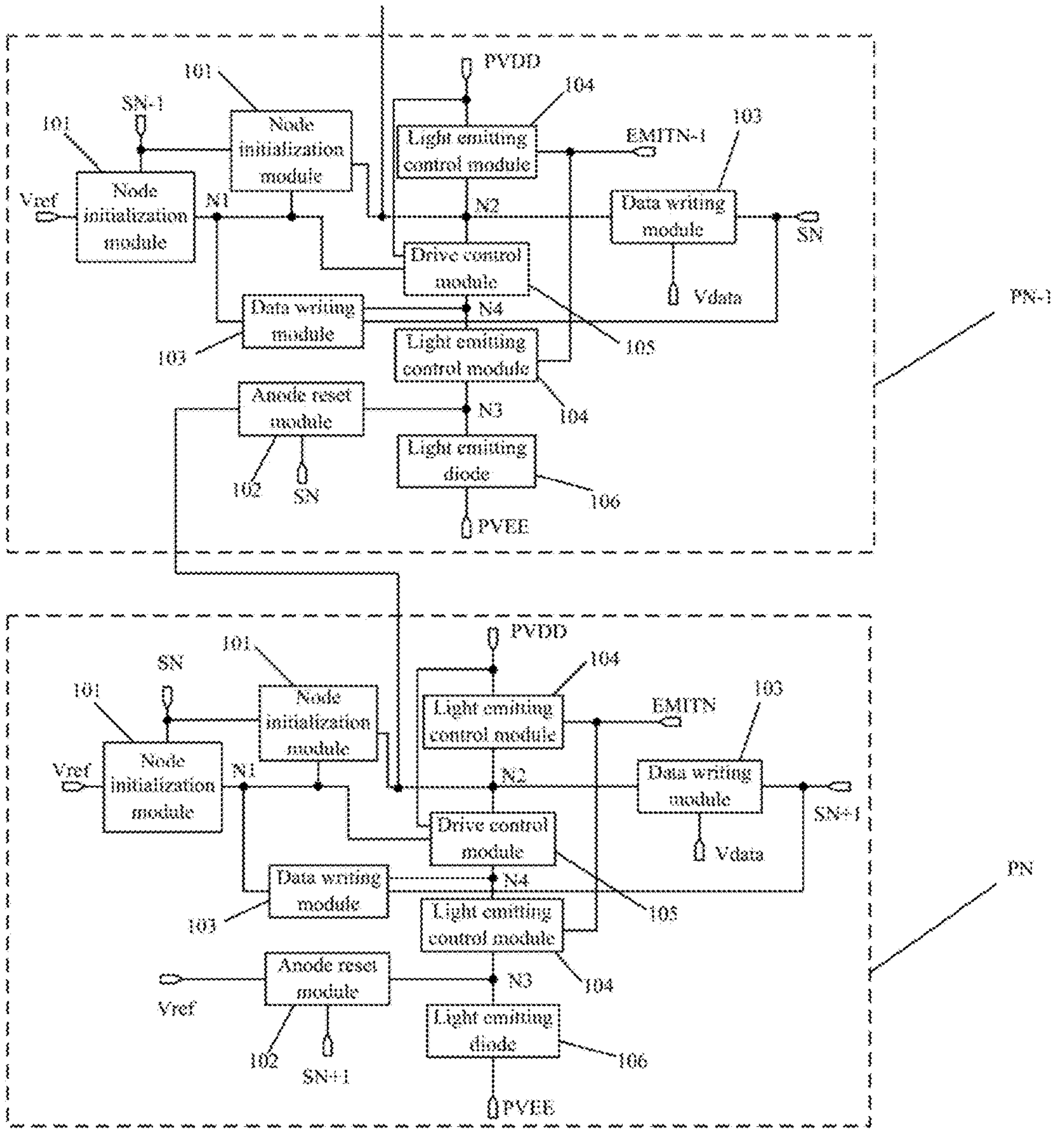
Figure 7:
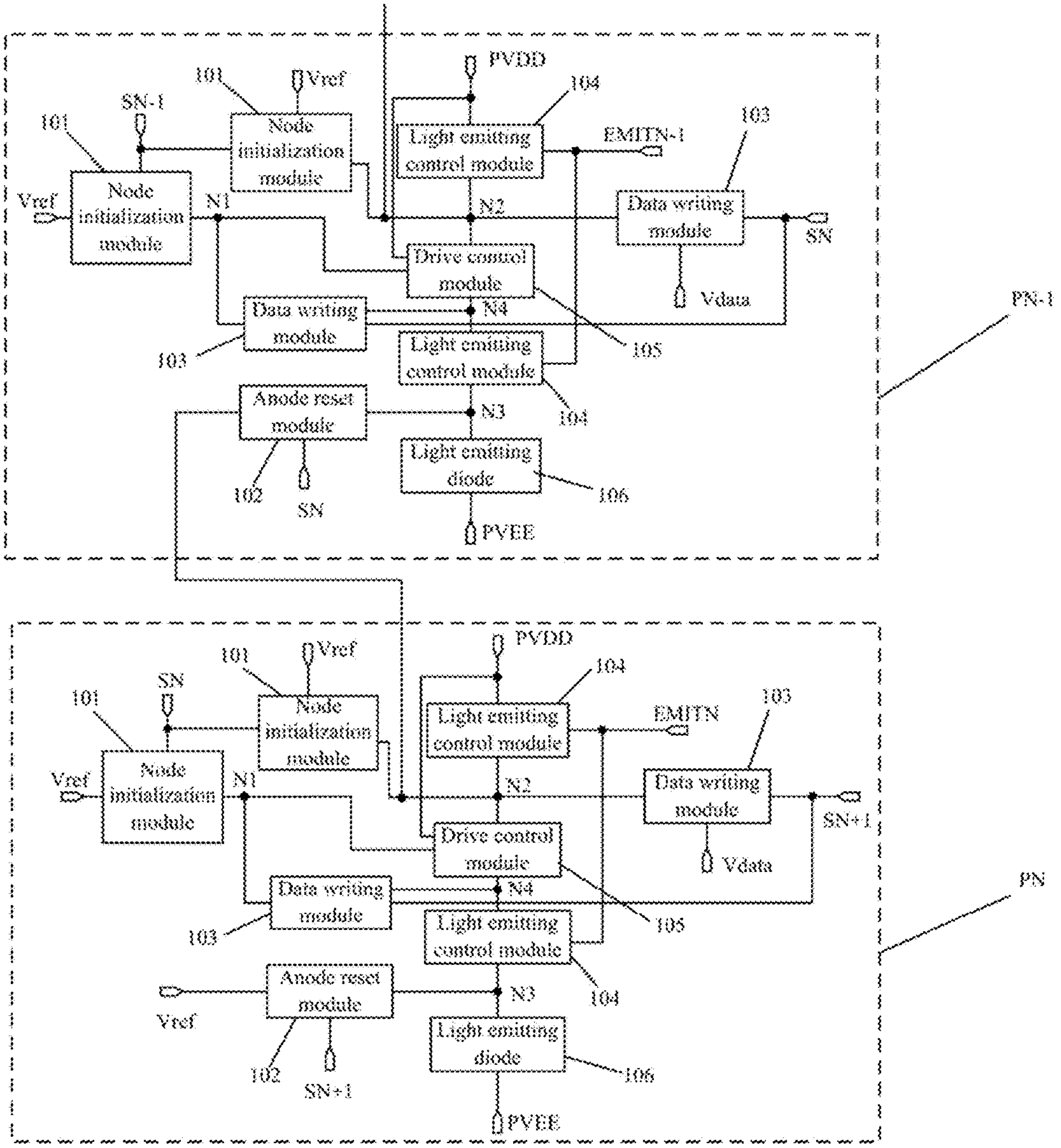

A second implementation: the connection passage provides a reference signal to a third terminal of an anode reset module 102 of a former pixel circuit of the every two adjacent pixel circuits, so that an anode of the former pixel circuit is reset while initializing the second node N2 of the latter pixel circuit; and as illustrated in FIG. 6 and FIG. 7, the dotted frame N represents a last pixel circuit of a column of pixel circuits, which is called pixel circuit PN, the dotted frame N−1 represents a penultimate pixel circuit adjacent to the last pixel circuit of the column of pixel circuits, which is called pixel circuit PN−1, and the connection passage between them provides a reference signal to a third terminal of an anode reset module 102 of the pixel circuit PN−1.

Figure 8:
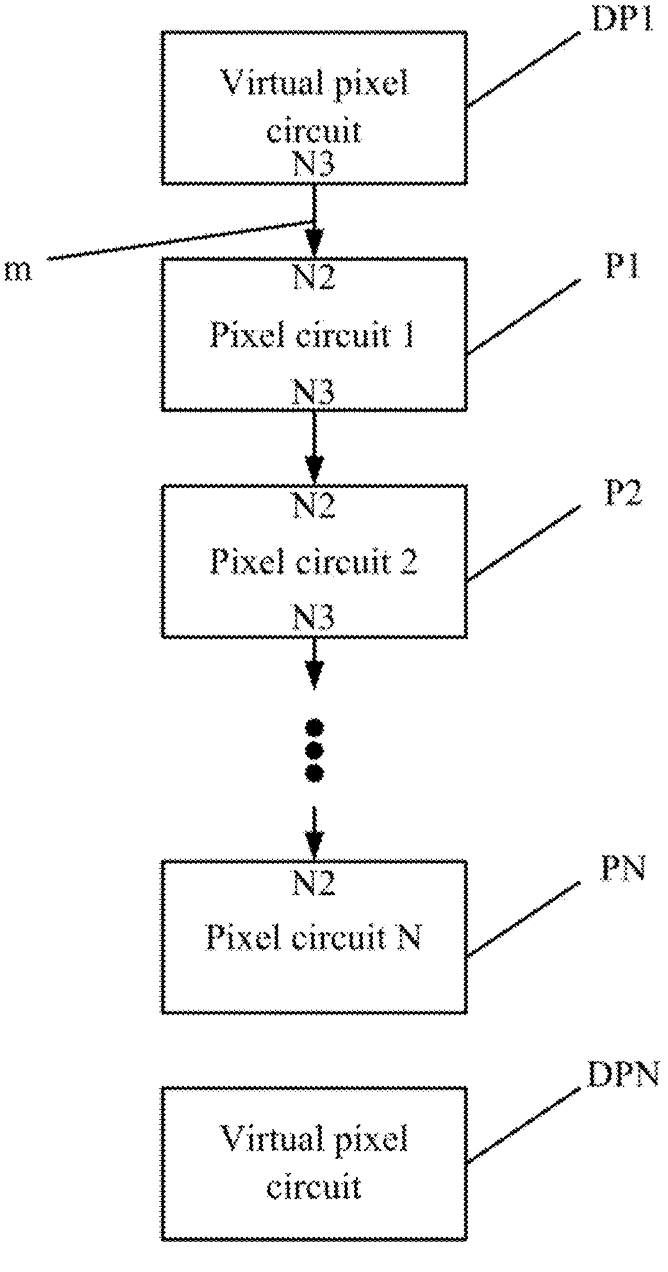
Figure 9:
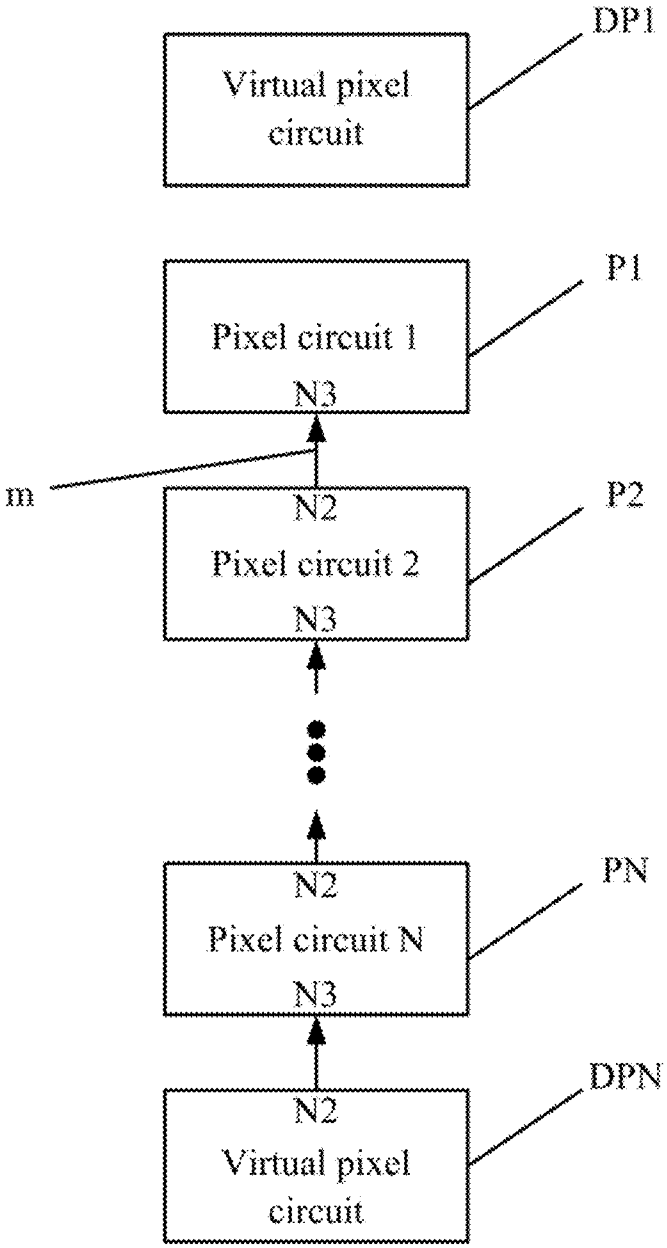

A third implementation: as illustrated in FIG. 8 and FIG. 9, only a connection passage between a virtual pixel circuit and a pixel circuit and the connection passage between the every two adjacent pixel circuits are illustrated; a virtual pixel circuit DP1 is arranged at the beginning of a column of pixel circuits, a virtual pixel circuit DPN is arranged at the end thereof, and the structure of each virtual pixel circuit is arranged the same as the structure of each pixel circuit (the particular structure of each pixel circuit is not illustrated); therefore, a connection passage m may be arranged between the virtual pixel circuit DP1 located at the beginning and the pixel circuit P1 adjacent thereto (arrow indicates the flowing direction of the reference signal), so that the virtual pixel circuit DP1 provides a reference signal to a fifth terminal of a node initialization module 101 of the pixel circuit P1 (i.e. the first pixel circuit), i.e. provides a reference signal to a second node N2 of the node initialization module 101 of the pixel circuit P1, and the connection passage located between the every two adjacent pixel circuits provides a reference signal to a fifth terminal of a node initialization module 101 of a latter pixel circuit of the every two adjacent pixel circuits (as illustrated in FIG. 8), i.e. provides a reference signal to a second node N2 of the node initialization module 101 of the latter pixel circuit of the every two adjacent pixel circuits; alternatively, a connection passage m may be arranged between the virtual pixel circuit DPN located at the end and the pixel circuit PN adjacent thereto (arrow indicates the flowing direction of the reference signal), so that the virtual pixel circuit DPN located at the end provides a reference signal to a third terminal of an anode reset module 102 of the pixel circuit PN (i.e. the last pixel circuit), i.e. provides a reference signal to a third node N3 of the anode reset module 102 of the pixel circuit PN, and the connection passage located between the every two adjacent pixel circuits provides a reference signal to a third terminal of an anode reset module 102 of a former pixel circuit of the every two adjacent pixel circuits (as illustrated in FIG. 9), i.e.

provides a reference signal to a third node N3 of the anode reset module 102 of the former pixel circuit of the every two adjacent pixel circuits.

Therefore, in all the three implementations above, a second node N2 can be initialized while initializing a first node N1, so that not only the reset conditions of respective frames can be guaranteed to be completely consistent, but also the number of signal terminals can be reduced, and the wiring space can be saved; in addition, the problem of threshold voltage being differently grabbed due to a voltage jump is effectively avoided, the consistency between the brightness of the first frame after a switch between high and low gray scales is guaranteed, and the afterimage due to the deviation of the threshold voltage of the drive transistor is effectively prevented. Although the virtual pixel circuit arranged in the electroluminescent display panel is used for initializing a second node N2 or resetting a third node N3 in the third implementation mode, the operation processes of respective modules therein are the same, and have no fundamental difference in essence, if the virtual pixel circuit is regarded as a pixel circuit; therefore, the implementation of the connection passage arranged between every two adjacent pixel circuits will be described in details below by taking the first implementation and the second implementation as examples.

In one or more embodiments, for the first implementation, in the electroluminescent display panel above according to the embodiment of the disclosure, as illustrated in FIG. 4 and FIG. 5, in each column of the plurality of pixel circuits, a fifth terminal of a node initialization module 101 of each pixel circuit other than a first pixel circuit P1, is electrically connected with a third node N3 of a previous pixel circuit; and a fifth terminal of a node initialization module 101 of the first pixel circuit P1 is electrically connected with a reference signal terminal Vref of the first pixel circuit P1 (as illustrated in FIG. 5) or electrically connected with a first node N1 of the first pixel circuit P1 (illustrated in FIG. 4).

In one or more embodiments, in order to enable a potential of a reference signal as a potential of a third node N3 under the control of an anode reset module 102, thus to provide the reference signal to a fifth terminal of a node initialization module 101 of the next pixel circuit, in the electroluminescent display panel above according to the embodiment of the disclosure, as illustrated in FIG. 4 and FIG. 5, a third terminal of an anode reset module 102 of each pixel circuit in each column of the plurality of pixel circuits is electrically connected with a reference signal terminal Vref.

In one or more embodiments, for the second implementation, in the electroluminescent display panel above according to the embodiment of the disclosure, as illustrated in FIG. 6 and FIG. 7, in each column of the plurality of pixel circuits, a third terminal of an anode reset module 102 of each pixel circuit other than a last pixel circuit PN, is electrically connected with a second node N2 of a next pixel circuit; and a third terminal of an anode reset module 102 of the last pixel circuit PN is electrically connected with a reference signal terminal Vref of the last pixel circuit PN.

In one or more embodiments, in order to enable a potential of a reference signal as a potential of a second node N2 under the control of a node initialization module 101, thus to provide the reference signal to a third terminal of an anode reset module 102 of a previous pixel circuit, in the electroluminescent display panel above according to the embodiment of the disclosure, as illustrated in FIG. 6 and FIG. 7, a fifth terminal of a node initialization module 101 of each pixel circuit in each column of the plurality of pixel circuits is electrically connected with a reference signal terminal Vref of the pixel circuit (as illustrated in FIG. 7) or electrically connected with a first node N1 of the pixel circuit (as illustrated in FIG. 6).

It shall be noted that in the electroluminescent display panel, all scan signal terminals are arranged in a column direction and emit scan signals from a scan control driver in a mode of line by line scan to drive respective pixel circuits, so that by taking the electroluminescent display panel as a whole, the serial numbers of the scan signal terminals are continuously arranged in sequence; for example, as illustrated in FIG. 4, from the pixel circuit P1 to the pixel circuit P2, the serial numbers of the scan signal terminals are S1, S2 and S3 in sequence, and the S2 is shared by the pixel circuit P1 and the pixel circuit P2; similarly, in each pixel circuit illustrated in FIG. 6 and FIG. 7, the SN is shared by the pixel circuit PN and the pixel circuit PN−1; for this reason, when a second scan signal is input from the second scan signal terminal S2, a node initialization module of the pixel circuit P2 is also in a conductive state while the anode reset module of the pixel circuit P1 is turned on, so that a second node N2 of the pixel circuit P2 is initialized while resetting a third node N3 of the pixel circuit P1, thereby effectively reducing the number of signal terminals.

Moreover, in each pixel circuit illustrated in FIG. 6 and FIG. 7, a serial number of a light emitting control signal terminal used for providing a light emitting control signal of each pixel circuit corresponds to a serial number of the pixel circuit, namely, in the pixel circuit PN−1, a control signal terminal used for providing a light emitting control signal is an (N−1)th light emitting control signal terminal, and in the pixel circuit PN, a control signal terminal used for providing a light emitting control signal is an Nth light emitting control signal terminal, and the respective light emitting control signal terminals are used to control respective pixel circuits to emit light in sequence.

Figure 10:
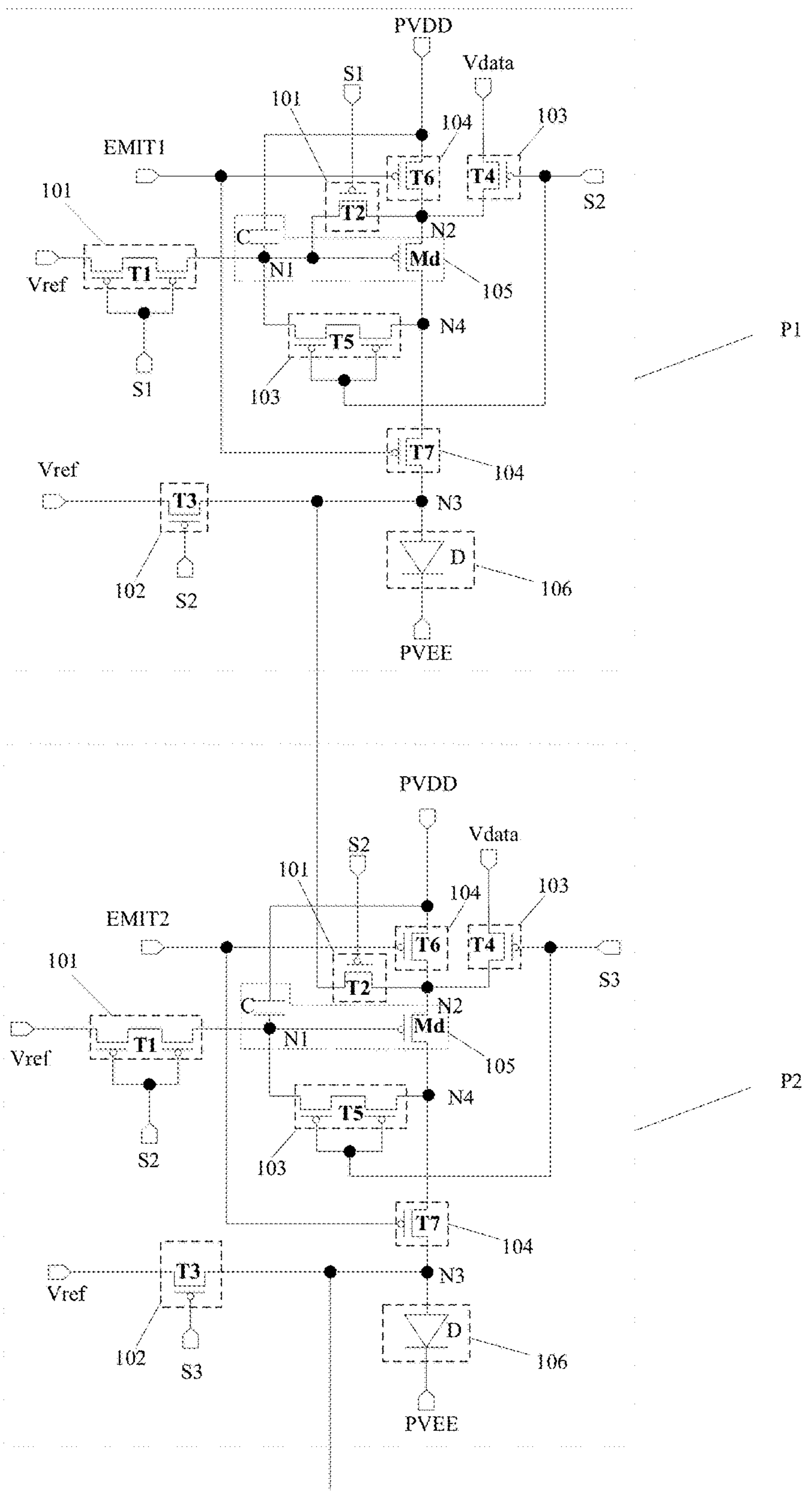
Figure 11:
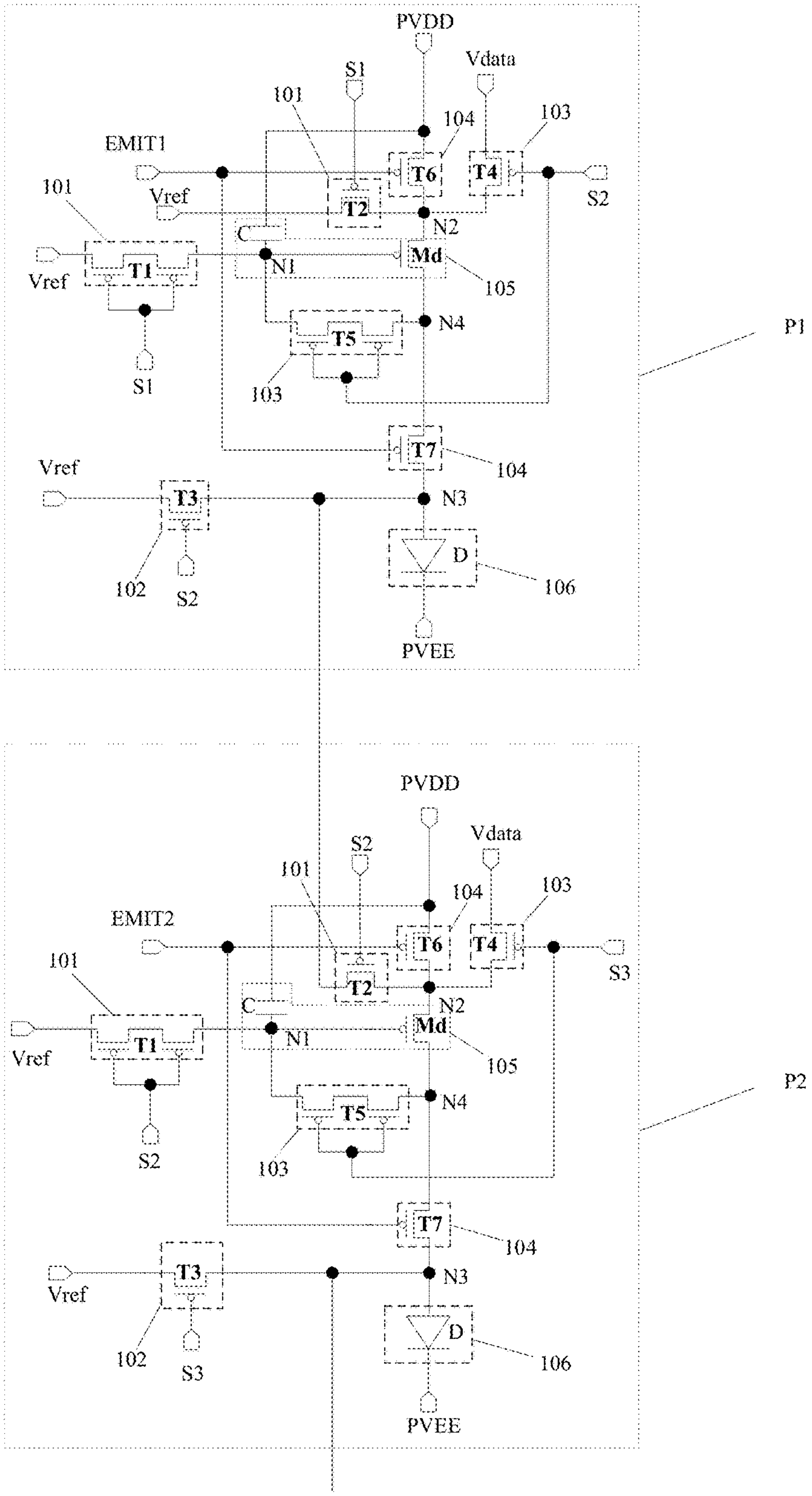
Figure 12:
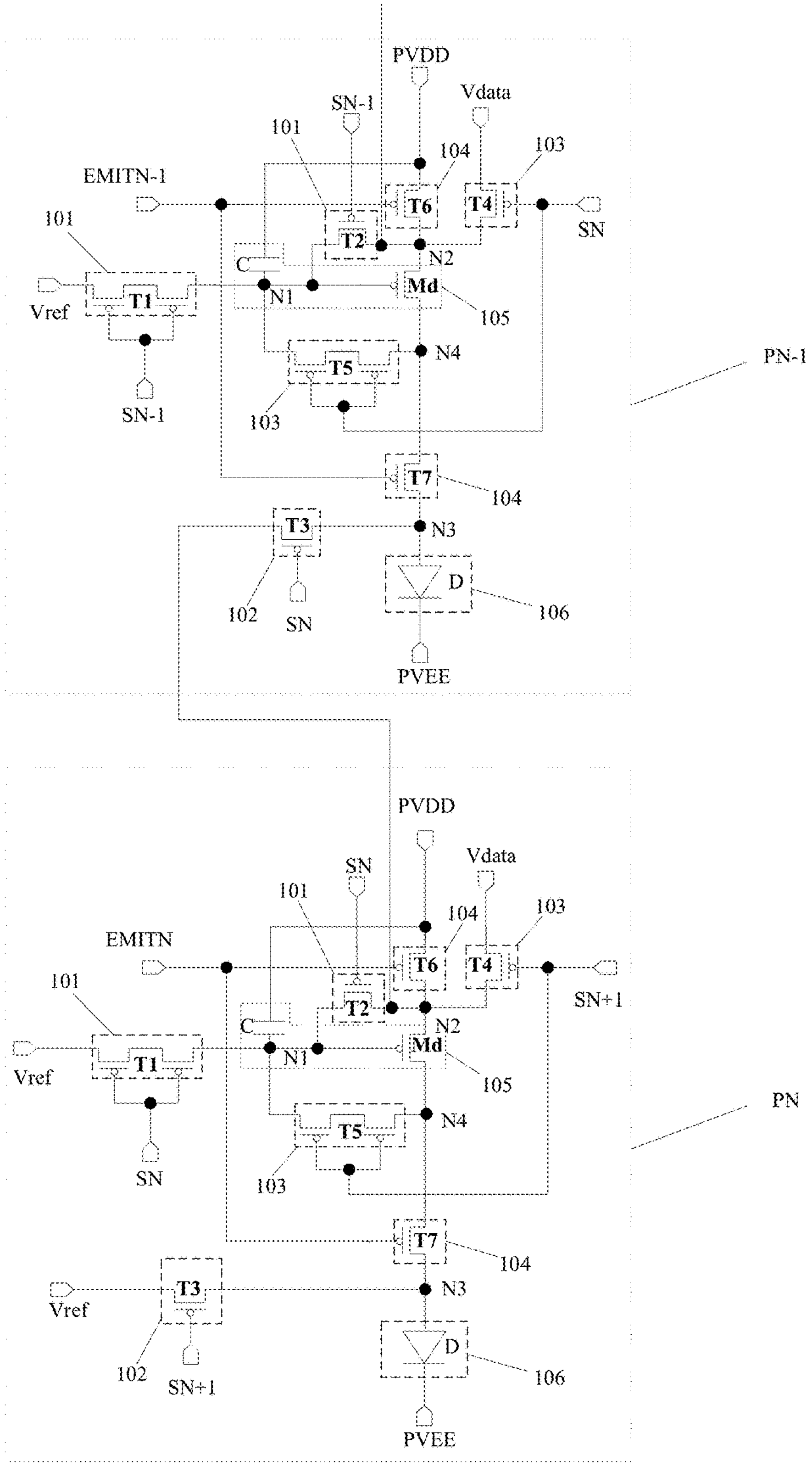
Figure 13:
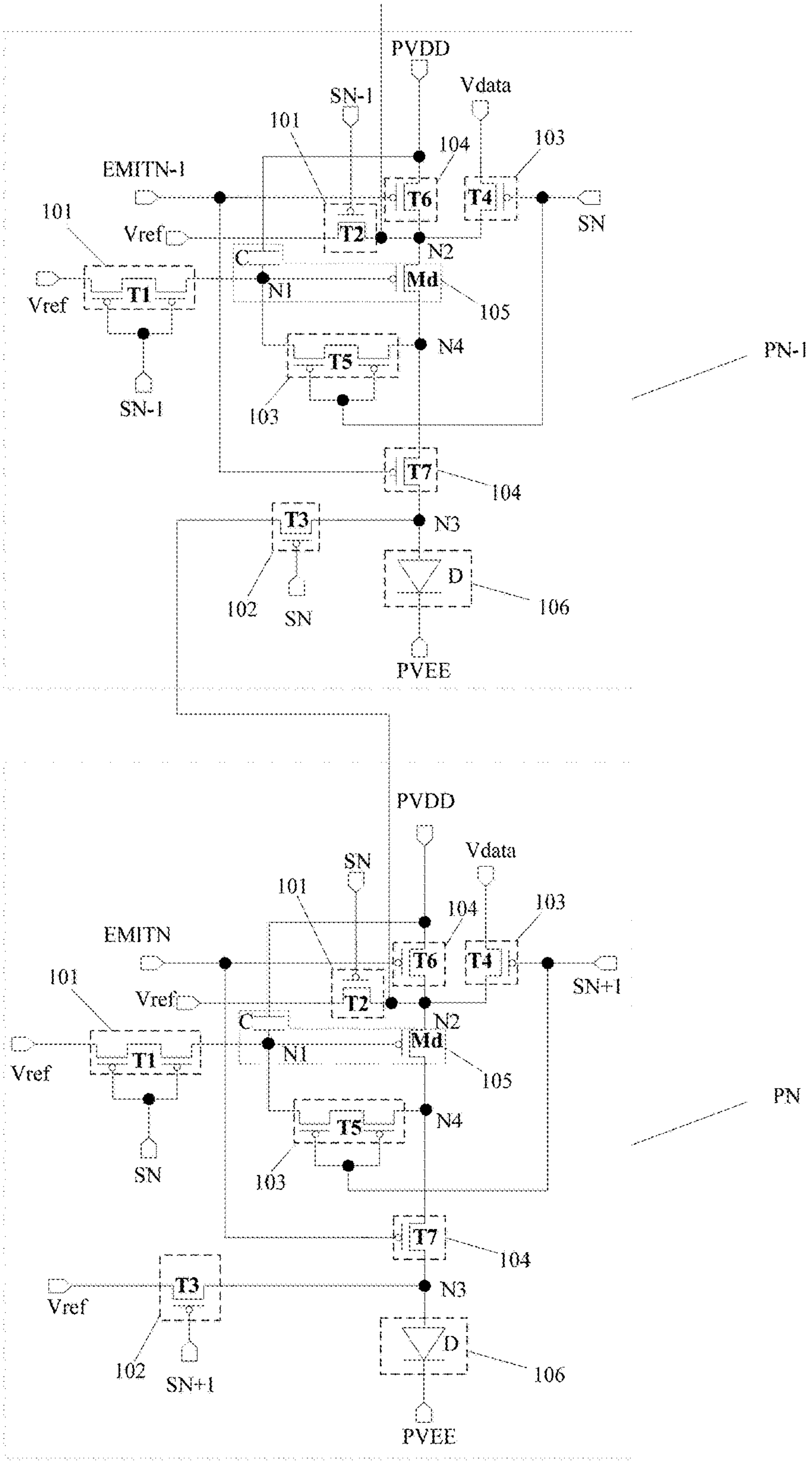

In a particular implementation, in order to clearly explain the working process of each module of each pixel circuit, FIG. 10 to FIG. 13 are provided, where FIG. 10 is a particular schematic structural diagram of a pixel circuit corresponding to FIG. 4, FIG. 11 is a particular schematic structural diagram of a pixel circuit corresponding to FIG. 5, FIG. 12 is a particular schematic structural diagram of a pixel circuit corresponding to FIG. 6, and FIG. 13 is a particular schematic structural diagram of a pixel circuit corresponding to FIG. 7. As illustrated in FIG. 10 and FIG. 11, in the pixel circuit P1, the scan signal terminals used for providing scan signals are S1 and S2 respectively, so that S1 can be used as a first scan signal terminal, S2 can be used as a second scan signal terminal, and a light emitting control signal terminal used for providing a light emitting control signal is EMIT1; while in the pixel circuit P2, the scan signal terminals used for providing scan signals are S2 and S3 respectively, so that S2 can be used as a first scan signal terminal, S3 can be used as a second scan signal terminal, and a light emitting control signal terminal used for providing a light emitting control signal is EMIT2. Similarly, as illustrated in FIG. 12 and FIG. 13, in the pixel circuit PN−1, the scan signal terminals used for providing scan signals are SN−1 and SN respectively, so that SN−1 can be used as a first scan signal terminal, SN can be used as a second scan signal terminal, and a light emitting control signal terminal used for providing a light emitting control signal is EMITN−1; while in the pixel circuit PN, the scan signal terminals used for providing scan signals are SN and SN+1 respectively, so that SN can be used as a first scan signal terminal, SN+1 can be used as a second scan signal terminal, and a light emitting control signal terminal used for providing a light emitting control signal is EMITN. Therefore, the particular structure of each pixel circuit will be explained below by taking the particular structure of the pixel circuit P1 illustrated in FIG. 10 and FIG. 11 as an example.

In one or more embodiments, in order to achieve a function of a node initialization module 101 thus to initialize a first node N1 and a second node N2, in the electroluminescent display panel above according to the embodiment of the disclosure, in the pixel circuit P1 as illustrated in FIG. 10 and FIG. 11, the node initialization module 101 may include: a first switch transistor T1 and a second switch transistor T2; wherein the first switch transistor T1 includes a gate electrically connected with a first scan signal terminal S1, a source electrically connected with a reference signal terminal Vref, and a drain electrically connected with a first node N1; and the second switch transistor T2 includes a gate electrically connected with the first scan signal terminal S1, a drain electrically connected with a second node N2, and a source used for receiving a reference signal.

In one or more embodiments, the first switch transistor T1 is configured to be controlled by a first scan signal input from the first scan signal terminal S1 to transmit a reference signal input from the reference signal terminal Vref to the first node N1; and the second switch transistor T2 is configured to be controlled by the first scan signal input from the first scan signal terminal S1 to transmit the received reference signal to the second node N2.

In one or more embodiments, both the first switch transistor T1 and the second switch transistor T2 may be P-type transistors, and when the first scan signal input from the first scan signal terminal S1 is at a low level, both the first switch transistor T1 and the second switch transistor T2 are in a conductive state (i.e. turned on). Both the first switch transistor T1 and the second switch transistor T2 may also be N-type transistors, and when the first scan signal input from the first scan signal terminal S1 is at a high level, both the first switch transistor T1 and the second switch transistor T2 are in a conductive state.

The particular structure of the node initialization module 101 has been described above only by way of an example, and in a particular implementation, the particular structure of the node initialization module 101 will not be limited to the structure above according to the embodiment of the disclosure, but can alternatively be another structure known to those skilled in the art, so the embodiment of the disclosure will not be limited thereto.

Further, in the pixel circuit P1 as illustrated in FIG. 10 and FIG. 11, the first switch transistor T1 may have a dual-gate structure, so that leakage current in the first switch transistor T1 which is turned off can be reduced to thereby lower interference to the drive transistor Md from the leakage current in the first switch transistor T1 in the light emitting stage, which would otherwise affect the drive current of the drive transistor Md. Therefore, in the electroluminescent display panel above according to the embodiment of the disclosure, the first switch transistor T1 has a dual-gate structure, and may include a first sub-switch transistor T11 and a second sub-switch transistor T12.

Wherein a drain of the first sub-switch transistor T11 is electrically connected with a source of the second sub-switch transistor T12; a gate of the first sub-switch transistor T11 and a gate of the second sub-switch transistor T12 are electrically connected with the first scan signal terminal S1 respectively; and a source of the first sub-switch transistor T11 is electrically connected with the reference signal terminal Vref, and a drain of the second sub-switch transistor T12 is electrically connected with the first node N1.

In one or more embodiments, when the first switch transistor T1 is a P-type transistor, both the first sub-switch transistor T11 and the second sub-switch transistor T12 are P-type transistors, and when the first scan signal input from the first scan signal terminal S1 is at a low level, both the first sub-switch transistor T11 and the second sub-switch transistor T12 are in a conductive state; and when the first switch transistor T1 is an N-type transistor, both the first sub-switch transistor T11 and the second sub-switch transistor T12 are N-type transistors, and when the first scan signal input from the first scan signal terminal S1 is at a high level, both the first sub-switch transistor T11 and the second sub-switch transistor T12 are in a conductive state.

In a particular implementation, in order to achieve a function of an anode reset module 102 thus to reset an anode, in the electroluminescent display panel above according to the embodiment of the disclosure, in the pixel circuit P1 as illustrated in FIG. 10 and FIG. 11, the anode reset module 102 may include: a third switch transistor T3; wherein the third switch transistor T3 includes a gate electrically connected with a second scan signal terminal S2, a drain electrically connected with a third node N3, and a source used for receiving a reference signal.

In one or more embodiments, the third switch transistor T3 is configured to be controlled by a second scan signal input from the second scan signal terminal S2 to transmit the received reference signal to the third node N3.

In one or more embodiments, the third switch transistor T3 may be a P-type transistor, and when the second scan signal input from the second scan signal terminal S2 is at a low level, the third switch transistor T3 is in a conductive state. The third switch transistor T3 may also be an N-type transistor, and when the second scan signal input from the second scan signal terminal S2 is at a high level, the third switch transistor T3 is in a conductive state.

The particular structure of the anode reset module 102 has been described above only by way of an example, and in a particular implementation, the particular structure of the anode reset module 102 will not be limited to the structure above according to the embodiment of the disclosure, but can alternatively be another structure known to those skilled in the art, so the embodiment of the disclosure will not be limited thereto.

In a particular implementation, in order to achieve a function of a data writing module 103, in the electroluminescent display panel above according to the embodiment of the disclosure, in the pixel circuit P1 as illustrated in FIG. 10 and FIG. 11, the data writing module 103 may include: a fourth switch transistor T4 and a fifth switch transistor T5.

Wherein the fourth switch transistor T4 includes a gate electrically connected with the second scan signal terminal S2, a source electrically connected with a data signal terminal Vdata, and a drain electrically connected with the second node N2; and the fifth switch transistor T5 includes a gate electrically connected with the second scan signal terminal S2, a source electrically connected with a fourth node N4, and a drain electrically connected with the first node N1.

In one or more embodiments, the fourth switch transistor T4 is configured to be controlled by a second scan signal input from the second scan signal terminal S2 to transmit a data signal input from the data signal terminal Vdata to the second node N2; and the fifth switch transistor T5 is configured to be controlled by the second scan signal input from the second scan signal terminal S2 to provide an electric potential at the fourth node N4 to the first node N1.

In one or more embodiments, both the fourth switch transistor T4 and the fifth switch transistor T5 may be P-type transistors, and when the second scan signal input from the second scan signal terminal S2 is at a low level, both the fourth switch transistor T4 and the fifth switch transistor T5 are in a conductive state. Both the fourth switch transistor T4 and the fifth switch transistor T5 may also be N-type transistors, and when the second scan signal input from the second scan signal terminal S2 is at a high level, both the fourth switch transistor T4 and the fifth switch transistor T5 are in a conductive state.

The particular structure of the data writing module 103 has been described above only by way of an example, and in a particular implementation, the particular structure of the data writing module 103 will not be limited to the structure above according to the embodiment of the disclosure, but can alternatively be another structure known to those skilled in the art, so the embodiment of the disclosure will not be limited thereto.

Similarly, in the pixel circuit P1 as illustrated in FIG. 10 and FIG. 11, the fifth switch transistor T5 may also have a dual-gate structure, so that the leakage current in the fifth switch transistor T5 which is turned off can be reduced to thereby lower interference to the drive transistor Md from the leakage current in the fifth switch transistor T5 in the light emitting stage, which would otherwise affect the drive current of the drive transistor Md. Therefore, in the electroluminescent display panel above according to the embodiment of the disclosure, the fifth switch transistor T5 has a dual-gate structure, and may include a third sub-switch transistor T51 and a fourth sub-switch transistor T52.

Wherein a source of the third sub-switch transistor T51 is electrically connected with a drain of the fourth sub-switch transistor T52; a gate of the third sub-switch transistor T51 and a gate of the fourth sub-switch transistor T52 are electrically connected with the second scan signal terminal S2 respectively; and a drain of the third sub-switch transistor T51 is electrically connected with the first node N1, and a source of the fourth sub-switch transistor T52 is electrically connected with the fourth node N4.

In one or more embodiments, when the fifth switch transistor T5 is a P-type transistor, both the third sub-switch transistor T51 and the fourth sub-switch transistor T52 are P-type transistors, and when the second scan signal input from the second scan signal terminal S2 is at a low level, both the third sub-switch transistor T51 and the fourth sub-switch transistor T52 are in a conductive state. When the fifth switch transistor T5 is an N-type transistor, both the third sub-switch transistor T51 and the fourth sub-switch transistor T52 are N-type transistors, and when the second scan signal input from the second scan signal terminal S2 is at a high level, both the third sub-switch transistor T51 and the fourth sub-switch transistor T52 are in a conductive state.

In a particular implementation, in order to achieve a function of a light emitting control module 104 thus to enable a light emitting diode 106 to emit light, in the electroluminescent display panel above according to the embodiment of the disclosure, in the pixel circuit P1 as illustrated in FIG. 10 and FIG. 11, the light emitting control module 104 may include a sixth switch transistor T6 and a seventh switch transistor T7.

Wherein the sixth switch transistor T6 includes a gate electrically connected with a light emitting control signal terminal EMIT1, a source electrically connected with a first voltage signal terminal PVDD, and a drain electrically connected with the second node N2; and the seventh switch transistor T7 includes a gate electrically connected with the light emitting control signal terminal EMIT1, a source electrically connected with the fourth node N4, and a drain electrically connected with the third node N3.

In one or more embodiments, the sixth switch transistor T6 is configured to be controlled by a light emitting control signal input from the light emitting control signal terminal EMIT1 to transmit a first voltage signal input from the first voltage signal terminal PVDD to the second node N2; and the seventh switch transistor T7 is configured to be controlled by the light emitting control signal input from the light emitting control signal terminal EMIT1 to transmit the electric potential at the fourth node N4 to the third node N3.

In one or more embodiments, both the sixth switch transistor T6 and the seventh switch transistor T7 may be P-type transistors, and when the light emitting control signal input from the light emitting control signal terminal EMIT1 is at a low level, both the sixth switch transistor T6 and the seventh switch transistor T7 are in a conductive state. Both the sixth switch transistor T6 and the seventh switch transistor T7 may also be N-type transistors, and when the light emitting control signal input from the light emitting control signal terminal EMIT1 is at a high level, both the sixth switch transistor T6 and the seventh switch transistor T7 are in a conductive state.

The particular structure of the light emitting control module 104 has been described above only by way of an example, and in a particular implementation, the particular structure of the light emitting control module 104 will not be limited to the structure above according to the embodiment of the disclosure, but can alternatively be another structure known to those skilled in the art, so the embodiment of the disclosure will not be limited thereto.

In a particular implementation, in order to achieve a function of a drive control module 105 thus to drive a light emitting diode 106 to emit light, in the electroluminescent display panel above according to the embodiment of the disclosure, in the pixel circuit P1 as illustrated in FIG. 10 and FIG. 11, the drive control module 105 may include a drive transistor Md and a capacitor C.

Wherein the drive transistor Md includes a gate electrically connected with the first node N1, a source electrically connected with the second node N2, and a drain electrically connected with the fourth node N4; and the capacitor C is connected between the first node N1 and the first voltage signal terminal PVDD.

In a particular implementation, the drive transistor Md and each switch transistor mentioned in the electroluminescent display panel above according to the embodiment of the disclosure can be embodied as N-type transistors, alternatively, as illustrated in FIG. 10 to FIG. 13, the drive transistor Md and each switch transistor can be embodied as P-type transistors. In this way, the manufacture process flow of a pixel circuit can be simplified.

It shall be noted that in the electroluminescent display panel above according to the embodiment of the disclosure, the drive transistor Md and each switch transistor above may be thin film transistors (TFTs), or may be metal oxide semiconductors (MOSs), which will not be limited herein. In a particular implementation, a source and a drain of each transistor may be exchanged, which will not be particularly distinguished. The described particular embodiments are described by taking the drive transistor and each transistor which are thin film transistors as examples.

Figure 14:
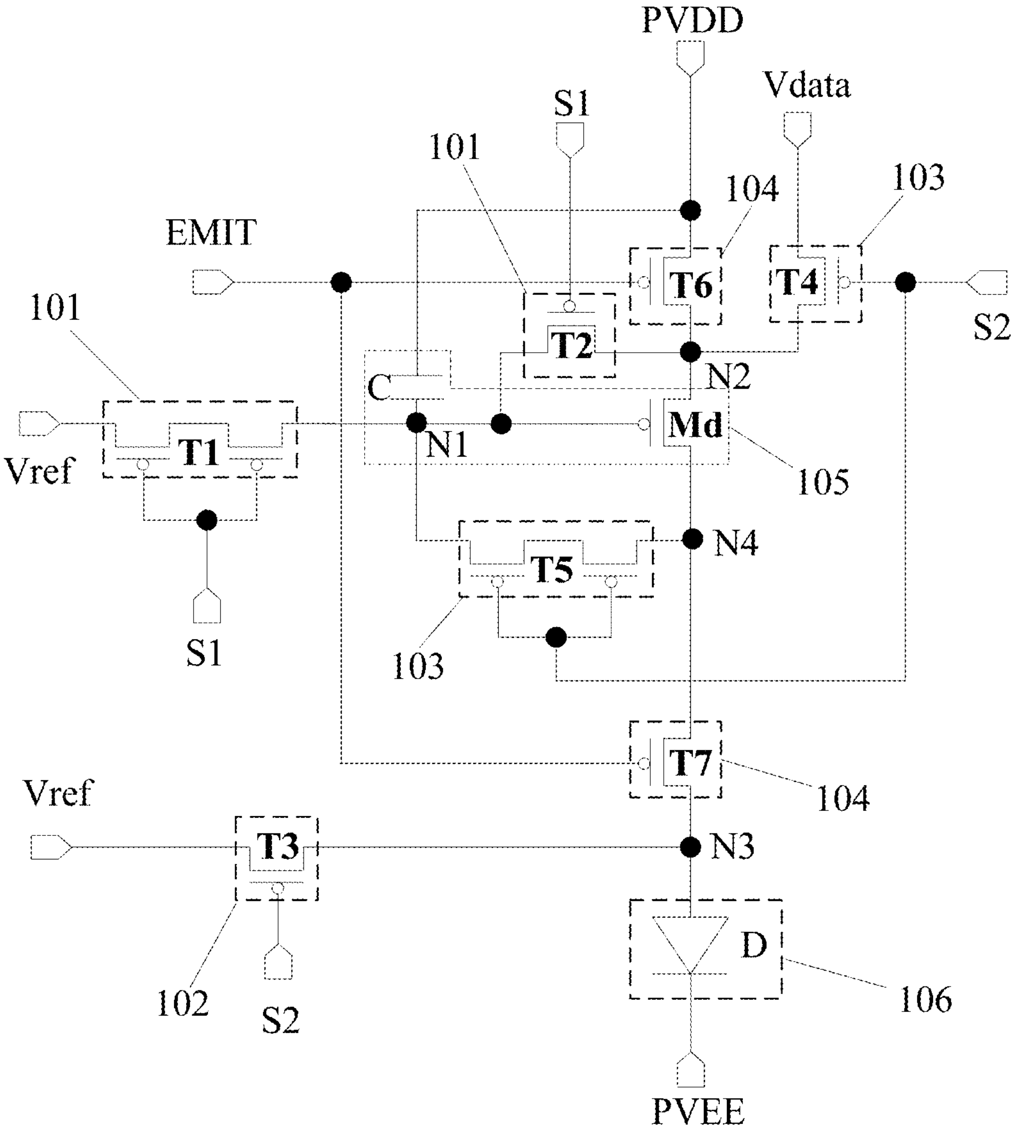

In a particular implementation, in the electroluminescent display panel above according to the embodiment of the disclosure, in order to prevent a certain pixel circuit of a column of pixel circuits connected from breaking down and then affecting the normal operation of other pixel circuits, in addition to the structure of a pixel circuit illustrated in FIG. 10 to FIG. 13, the structure of a pixel circuit may also be as illustrated in FIG. 14, namely, no connection passage exists between every two adjacent pixel circuits of a column of pixel circuits, and in a pixel circuit, a second node N2 can be initialized and a third node N3 can be reset.

In one or more embodiments, in the pixel circuit illustrated in FIG. 14, the second switch transistor T2 includes a gate electrically connected with the first scan signal terminal S1, a source electrically connected with the first node N1, and a drain electrically connected with the second node N2. The second switch transistor T2 is configured to be controlled by a first scan signal input from the first scan signal terminal S1 to provide a potential of the first node N1 to the second node N2. Thus, in the initialization stage, the second node N2 is initialized while initializing the first node N1, thereby avoiding the difference caused by the parasitic capacitance between the first node N1 and the second node N2, then the problem of threshold voltage being differently grabbed due to a voltage jump is avoided, and the afterimage due to the deviation of the threshold voltage of the drive transistor Md is prevented.

Of course, the source of the second switch transistor T2 is not limited to be electrically connected with the first node N1 as illustrated in FIG. 14, may also be electrically connected with the reference signal terminal Vref directly, and can be used for directly receiving the reference signal input from the reference signal terminal Vref, to guarantee the stability of the received reference signal.

The operation process of the pixel circuit of the electroluminescent display panel above according to the embodiment of the present disclosure will be described in details below in combination with several particular embodiments.

In one or more embodiments, the operation process of the pixel circuit of the electroluminescent display panel above according to the embodiment of the present disclosure is described below in combination with the input-output time sequence diagrams illustrated in FIG. 15 and FIG. 16 by taking the structure of the pixel circuit illustrated in FIG. 11 and FIG. 13 as an example. In the following description, 1 represents a high potential, and 0 represents a low potential. It shall be noted that 1 and 0 represent logic potentials, which are only used to better set forth a particular operation process according to an embodiment of the disclosure, but not to suggest any particular voltage values applied onto the gate of each switch transistor.

Figure 15:
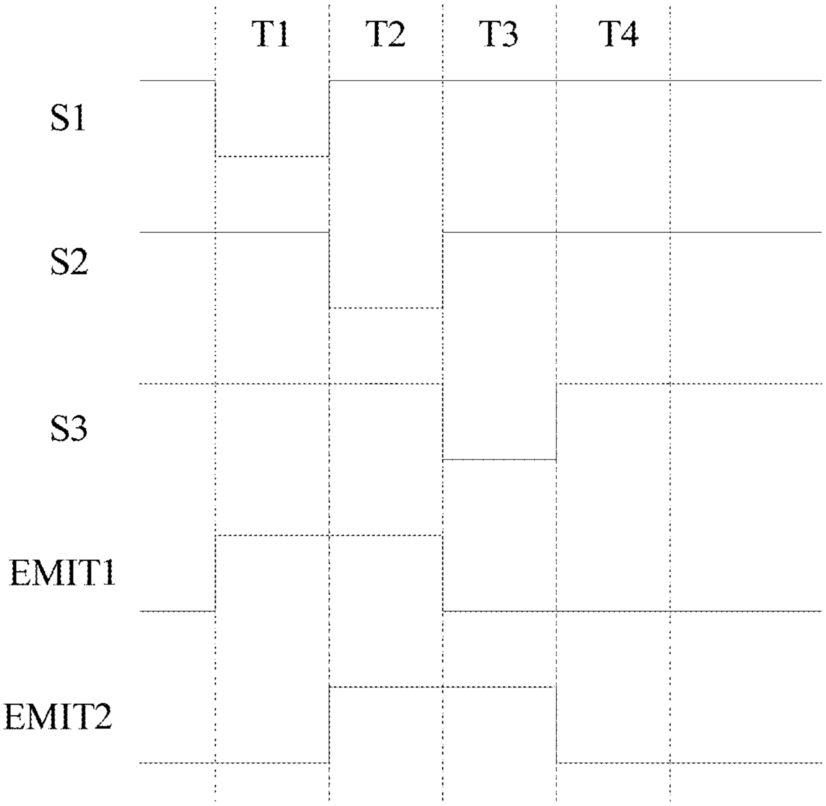
FIG. 15 and FIG. 16 are input-output time sequence diagrams according to embodiments of the disclosure.

In one or more embodiments, the structure of the pixel circuit illustrated in FIG. 11 and the input-output time sequence diagram illustrated in FIG. 15 are taken as examples; and four stages, i.e. T1-T4 in the input-output sequence diagram illustrated in FIG. 15 are mainly selected.

In the T1 stage, S1=0, S2=1, S3=1, EMIT1=1, EMIT2=0, and this stage is an initialization stage of the pixel circuit P1.

Since S1=0, in the pixel circuit PN−1, the first switch transistor T1 and the second switch transistor T2 are turned on, the first switch transistor T1 transmits the reference signal input from the reference signal terminal Vref to the first node N1, and the second switch transistor T2 transmits the reference signal input from the reference signal terminal Vref to the second node N2, so that N1=Vref and N2=Vref. Thus, the drive transistor Md is initialized, and the organic light emitting diode D does not emit light.

In the T2 stage, S1=1, S2=0, S3=1, EMIT1=1, EMIT2=1, and this stage is a data writing stage of the pixel circuit P1 and an initialization stage of the pixel circuit P2.

In the pixel circuit P1, since S2=0, the third switch transistor T3 is turned on and transmits the reference signal input from the reference signal terminal Vref to the third node N3, so that N3=Vref, and the anode is reset. Meanwhile, both the fourth switch transistor T4 and the fifth switch transistor T5 are in a conductive state, and the fourth switch transistor T4 transmits the data signal input from the data signal terminal Vdata to the second node N2, so that N2=Vdata; and the fifth switch transistor T5 is turned on to connect the gate of the drive transistor Md with the drain thereof, and the potentials of the first node N1 and the fourth node N4 are changed to Vdata−|Vth|. At this moment, the Vsg of the drive transistor Md is changed from 0 to Vdata−Vref to |Vth|, so the same threshold voltage can be grabbed no matter whether there is a jump from a high or low grayscale to a middle grayscale; since EMIT=1, both the sixth switch transistor T6 and the seventh switch transistor T7 are turned off, and the organic light emitting diode D does not emit light.

In the pixel circuit P2, since S2=0, the first switch transistor T1 and the second switch transistor T2 are turned on, and the first switch transistor T1 transmits the reference signal input from the reference signal terminal Vref to the first node N1, so that N1=Vref; and since the source of the second switch transistor T2 is electrically connected with the third node N3 of the pixel circuit P1, and the potential of the third node N3 of the pixel circuit P1 is Vref in this stage, the second switch transistor T2 transmits the potential Vref of the third node N3 of the pixel circuit P1 to the second node N2, so that N2=Vref, and the drive transistor Md is initialized, and the organic light emitting diode D does not emit light.

In the T3 stage, S1=1, S2=1, S3=0, EMIT1=0, EMIT2=1, and this stage is a light emitting stage of the pixel circuit P1 and a data writing stage of the pixel circuit P2.

In the pixel circuit P1, since S1=1, both the first switch transistor T1 and the second switch transistor T2 are turned off. Since S2=1, the third switch transistor T3, the fourth switch transistor T4 and the fifth switch transistor T5 are all turned off. Since EMIT1=0, the sixth switch transistor T6 is turned on to provide the high potential of the first voltage signal terminal PVDD to the source of the drive transistor Md, and the potential of the second node N2 is changed to PVDD. At this moment, in the drive transistor Md, Vsg=N2−N1=PVDD−Vdata+|Vth|, $I=K(Vsg-|Vth|)^2=K(PVDD-Vdata)^2$; and the seventh switch transistor T7 is turned on, so that the organic light emitting diode D is driven by the drive current of the drive transistor Md to emit light.

In the pixel circuit P2, since only S3=0, this stage is the data writing stage of the pixel circuit P2. Thus, the data writing stage of the pixel circuit P2 is the same as that of the pixel circuit P1, and reference can be made to the data writing stage (i.e. the T2 stage) of the pixel circuit P1 for details; so a repeated description thereof will be omitted here.

In the T4 stage, S1=1, S2=1, S3=1, EMIT1=1, EMIT2=0, and this stage is a light emitting stage of the pixel circuit P2.

In the pixel circuit P2, since EMIT2=0, this stage is the light emitting stage of the pixel circuit P2. Thus, the light emitting stage of the pixel circuit P2 is the same as that of the pixel circuit P1, and reference can be made to the light emitting stage (i.e. the T3 stage) of the pixel circuit P1 for details; so a repeated description thereof will be omitted here.

As can be known from the operation process above, a reference signal may be provided for the source of the second switch transistor T2 of the pixel circuit P2 while resetting the third node N3 (i.e. the anode) of the pixel circuit P1 by arranging a connection passage between the pixel circuit P1 and the pixel circuit P2, and thus the second node N2 of the pixel circuit P2 is initialized. Therefore, the number of signal terminals and the wiring space are effectively reduced, and the problem of threshold voltage being differently grabbed due to a voltage jump is effectively solved, thereby guaranteeing the consistency of the brightness of the first frame after switching between high and low gray scales.

Figure 16:
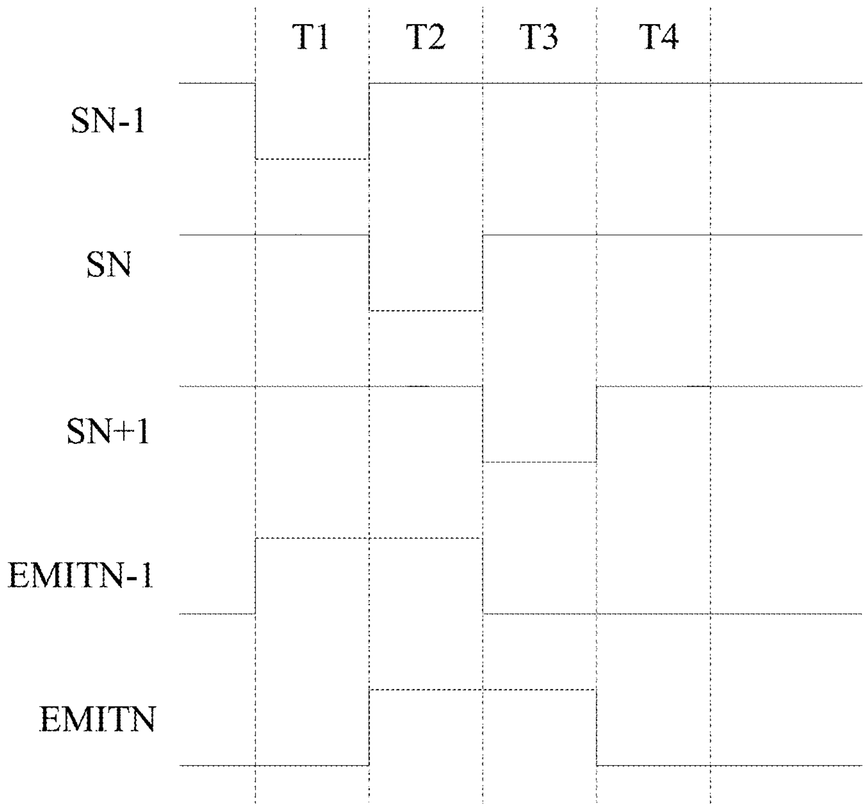

In one or more embodiments, the structure of the pixel circuit illustrated in FIG. 13 and the input-output time sequence diagram illustrated in FIG. 16 are taken as examples; similarly, four stages, i.e. T1-T4 in the input-output time sequence diagram illustrated in FIG. 16 are mainly selected.

In the T1 stage, SN−1=0, SN=1, SN+1=1, EMITN−1=1 and EMITN=0, and this stage is an initialization stage of the pixel circuit PN−1.

Since SN−1=0, in the pixel circuit PN−1, the first switch transistor T1 and the second switch transistor T2 are turned on. Thus, the first switch transistor T1 transmits the reference signal input from the reference signal terminal Vref to the first node N1, and the second switch transistor T2 transmits the reference signal input from the reference signal terminal Vref to the second node N2, so that N1=Vref and N2=Vref. The drive transistor Md is initialized, and the organic light emitting diode D does not emit light.

In the T2 stage, SN−1=1, SN=0, SN+1=1, EMITN−1=1 and EMITN=1, and this stage is a data writing stage of the pixel circuit PN−1 and an initialization stage of the pixel circuit PN.

In the pixel circuit PN, since only SN=0, this stage is the initialization stage of the pixel circuit PN, namely, the drive transistor Md is initialized so that N1=N2=Vref. Thus, the initialization stage of the pixel circuit PN is the same as that of the pixel circuit PN−1, and reference can be made to the initialization stage (i.e. the T1 stage) of the pixel circuit PN−1 for details, so a repeated description thereof will be omitted here.

In the pixel circuit PN−1, since SN=0, the third switch transistor T3 is turned on. Since the source of the third switch transistor T3 is electrically connected with the second node N2 of the pixel circuit PN, and the potential of the second node N2 of the pixel circuit PN in this stage is Vref, the third switch transistor T3 transmits the potential Vref of the second node N2 of the pixel circuit PN to the third node N3, so that N3=Vref, and the third node N3 (i.e. the anode) is reset. Meanwhile, both the fourth switch transistor T4 and the fifth switch transistor T5 are also in a conductive state, and the fourth switch transistor T4 transmits the data signal input from the data signal terminal Vdata to the second node N2, so that N2=Vdata; and the fifth switch transistor T5 is turned on to connect the gate of the drive transistor Md and the drain thereof, and the potentials of the first node N1 and the fourth node N4 are changed to Vdata−|Vth|. At this moment, Vsg of the drive transistor Md is changed from 0 to Vdata−Vref to |Vth|. Therefore, the same threshold voltage can be grabbed no matter whether there is a jump from a high or low grayscale to a middle grayscale. Since EMITN−1=1, both the sixth switch transistor T6 and the seventh switch transistor T7 are turned off, and the organic light emitting diode D does not emit light.

In the T3 stage, SN−1=1, SN=1, SN+1=0, EMITN−1=0 and EMITN=1, and this stage is a light emitting stage of the pixel circuit PN−1 and a data writing stage of the pixel circuit PN.

In the pixel circuit PN−1, since SN−1=1, both the first switch transistor T1 and the second switch transistor T2 are turned off. Since SN=1, the third switch transistor T3, the fourth switch transistor T4 and the fifth switch transistor T5 are all turned off. Since EMITN−1=0, the sixth switch transistor T6 is turned on to provide the high potential of the first voltage signal terminal PVDD to the source of the drive transistor Md, and the potential of the second node N2 is changed to PVDD. At this moment, in the drive transistor Md, Vsg=N2−N1=PVDD−Vdata+|Vth|, $I=K(Vsg-|Vth|)^2=K(PVDD-Vdata)^2$. The seventh switch transistor T7 is turned on, so that the organic light emitting diode D is driven by the drive current of the drive transistor Md to emit light.

In the pixel circuit PN, since only SN+1=0, this stage is the data writing stage of the pixel circuit PN. Thus, the data writing stage of the pixel circuit PN is the same as that of the pixel circuit PN−1, and reference can be made to the data writing stage (i.e. the T2 stage) of the pixel circuit PN−1 for details, so a repeated description thereof will be omitted here.

In the T4 stage, SN−1=1, SN=1, SN+1=1, EMITN−1=1 and EMITN=0, and this stage is a light emitting stage of the pixel circuit PN.

In the pixel circuit PN, since EMITN=0, this stage is the light emitting stage of the pixel circuit PN. Thus, the light emitting stage of the pixel circuit PN is the same as that of the pixel circuit PN−1, and reference can be made to the light emitting stage (i.e. the T3 stage) of the pixel circuit PN−1 for details, so a repeated description thereof will be omitted here.

As can be known from the operation process above, a reference signal may be provided for the source of the third switch transistor T3 of the pixel circuit PN−1 while initializing the second node N2 of the pixel circuit PN by arranging a connection passage between the pixel circuit PN−1 and the pixel circuit PN, and thus the third node N3 (i.e. the anode) of the pixel circuit PN−1 is reset. Therefore, the number of signal terminals and wiring space are effectively reduced, and the problem of threshold voltage being differently grabbed due to a voltage jump is effectively solved, thereby guaranteeing the consistency of the brightness of the first frame after switching between high and low gray scales.

Figure 17:
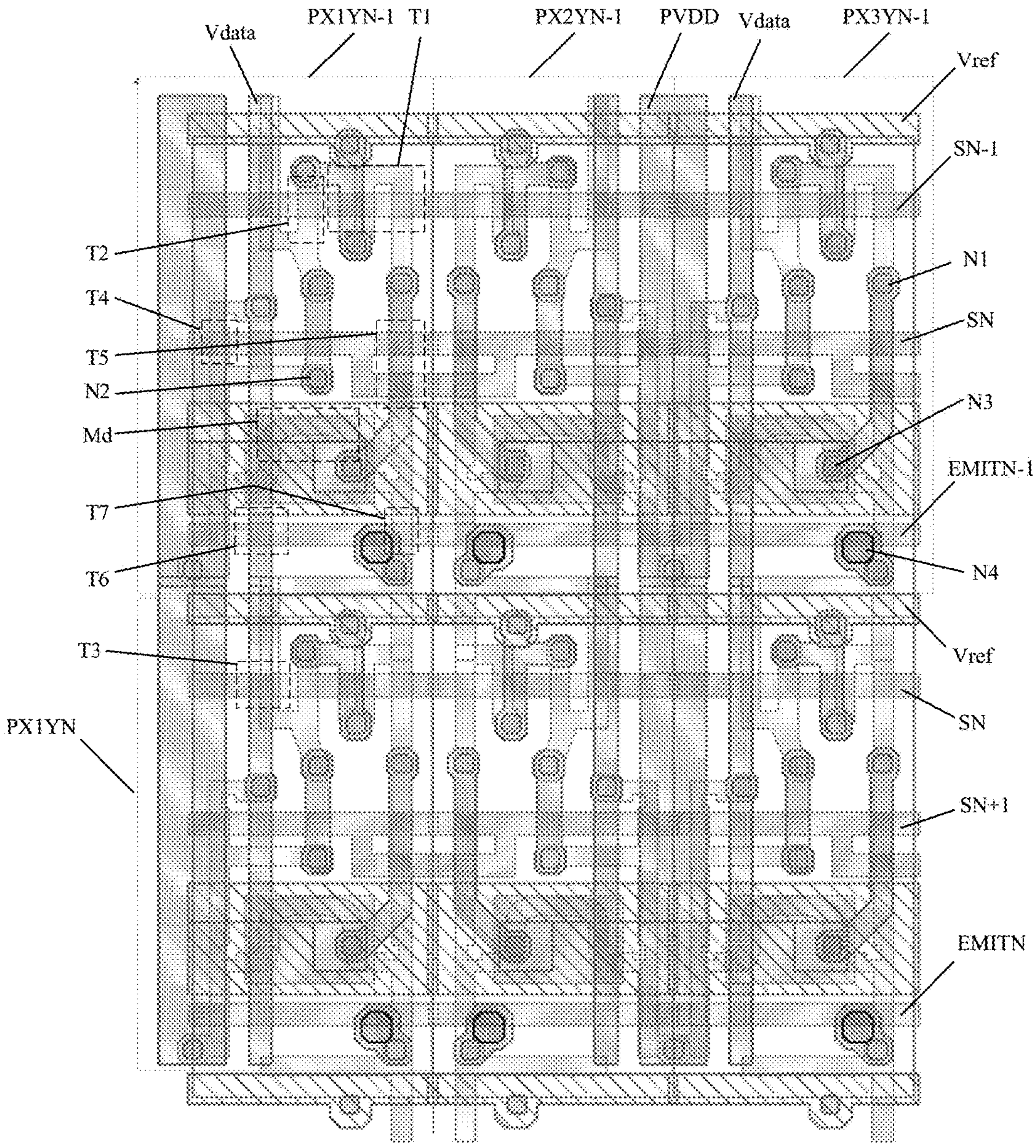
FIG. 17 is a schematic structural diagram of some pixel circuits of an electroluminescent display panel according to an embodiment of the disclosure.

In a particular implementation, in order to achieve the above drive process, in the electroluminescent display panel above according to the embodiment of the disclosure, the layout diagram of each pixel circuit is as illustrated in FIG. 17, and the layout diagram illustrated in FIG. 17 corresponds to the pixel circuit illustrated in FIG. 13. In one or more embodiments, in the electroluminescent display panel above according to the embodiment of the disclosure, as illustrated in FIG. 7, in order to save the circuit wiring space and to make circuits be more compact, two adjacent pixel circuits PX1YN−1 and PX2YN−1, PX2YN−1 and PX3YN−1 of each row may be arranged in a mirror image mode, i.e. arranged in a bilateral symmetry mode.

In one or more embodiments, in the electroluminescent display panel above according to the embodiment of the disclosure, as illustrated in FIG. 17, the electroluminescent display panel may also include: a plurality of scan signal lines (such as SN−1, SN and SN+1), a plurality of reference signal lines Vref, a plurality of light emitting control signal lines (including EMITN−1 and EMITN), a plurality of data signal lines Vdata and a plurality of first voltage signal lines PVDD, wherein in general, the plurality of scan signal lines (such as SN−1, SN and SN+1), the plurality of reference signal lines Vref and the plurality of light emitting control signal lines (including EMITN−1 and EMITN) are substantially parallel with one another and may be arranged on the same metal film layer; and the plurality of data signal lines Vdata and the plurality of first voltage signal lines PVDD may be arranged on the same metal film layer.

Further, in the electroluminescent display panel above according to the embodiment of the disclosure, as illustrated in FIG. 17, the source, drain and channel region of each transistor may be arranged on a semiconductor layer, a corresponding doping process may be conducted on the source and drain, and the semiconductor layer may be made of low-temperature polycrystalline silicon in general, and the semiconductor layer may be located under the first metal layer in general according to a process need.

In a particular implementation, in the electroluminescent display panel above according to the embodiment of the disclosure, as illustrated in FIG. 17, in order to save the circuit wiring space and to make the circuits be more compact, at least two columns of adjacent pixel circuits PX2YN−1 and PX3YN−1 may be connected to the same first voltage signal line PVDD.

In one or more embodiments, since the layout diagram illustrated in FIG. 17 corresponds to the structure of the pixel circuit illustrated FIG. 13 and a source of a third switch transistor T3 of the pixel circuit PX1YN−1 is electrically connected with a second node N2 of the pixel circuit PX1YN, when the layout diagram is designed, to reduce the wiring number and save wiring space and to make the circuits more compact, the third switch transistor T3 of the pixel circuit PX1YN−1 may be arranged in the pixel circuit PX1YN.

Based on the same inventive concept, an embodiment of the disclosure further provides a method for driving the electroluminescent display panel above according to the embodiment of the disclosure, including following operations.

Providing, by a connection passage arranged between every two adjacent pixel circuits of each column of the plurality of pixel circuits, a node initialization module of one of the every two adjacent pixel circuits with a reference signal, in an initialization stage of the one of the every two adjacent pixel circuits; or, providing, by the connection passage, an anode reset module of the one of the every two adjacent pixel circuits with a reference signal, in a data writing stage of the one of the every two adjacent pixel circuits.

In a particular implementation, in the method above according to the embodiment of the disclosure, in T1-T3 stages as illustrated in FIG. 15, the method may include following operations.

In an initialization stage (i.e. the T1 stage), providing a first level signal to a first scan signal terminal of each pixel circuit, providing a second level signal to a second scan signal terminal and a light emitting control signal terminal of the each pixel circuit.

In a data writing stage (i.e. the T2 stage), providing the second level signal to the first scan signal terminal of the each pixel circuit, providing the first level signal to the second scan signal terminal of the each pixel circuit, and providing the second level signal to the light emitting control signal terminal of the each pixel circuit.

In a light emitting stage (i.e. the T3 stage), providing the second level signal to the first scan signal terminal of the each pixel circuit, providing the second level signal to the second scan signal terminal of the each pixel circuit, and providing the first level signal to the light emitting control signal terminal of the each pixel circuit.

In one or more embodiments, in the method for driving the electroluminescent display panel above according to the embodiment of the disclosure, the first level signal may be a high potential signal, and accordingly, the second level signal may be a low potential signal; or vice versa, as illustrated in FIG. 15 and FIG. 16, the first level signal may be a low potential signal, and accordingly, the second level signal may be a high potential signal, depending on whether a switch transistor is an N-type transistor or a P-type transistor.

Figure 18:
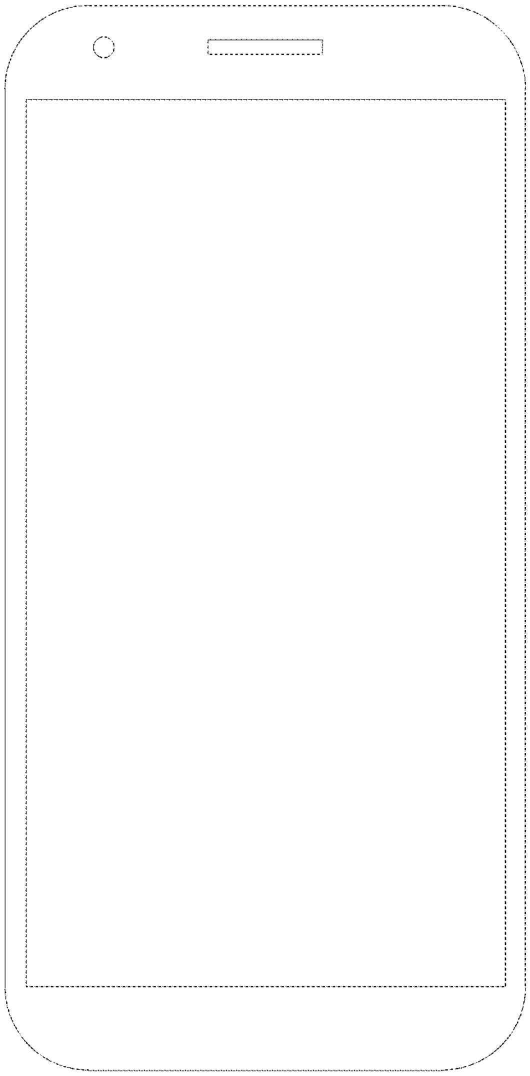
FIG. 18 is a schematic structural diagram of a display device according to an embodiment of the disclosure.

On the basis of the same inventive concept, an embodiment of the disclosure further provides a display device, which may include the electroluminescent display panel above according to the embodiment of the disclosure. Of course, the display device can be any product or component having a display function, such as a mobile phone (as illustrated in FIG. 18), a tablet personal computer, a television set, a display, a laptop, a digital photo frame, a navigator, etc. It shall be understood by those skilled in the art that other essential components of the display device shall be present, which will not be repeated herein and shall not be used to limit the disclosure.

Embodiments of the present disclosure provide an electroluminescent display panel and a method for driving the same, and a display device. The electroluminescent display panel includes a plurality of pixel circuits arranged in an array, each pixel circuit including a node initialization module and an anode reset module; wherein by arranging a connection passage between every two adjacent pixel circuits of each column of the plurality of pixel circuits, a reference signal is provided for either an anode reset module or a node initialization module of one of the every two adjacent pixel circuits, so that not only key nodes can be initialized via a node initialization module, thereby avoiding the problem of threshold voltage being differently grabbed due to a voltage jump and effectively preventing the afterimage from occurring as a result of the deviating threshold voltage of the drive transistor, but also the reference signal can be provided for an anode reset module or a node initialization module of an adjacent pixel circuit, thereby reducing the number of signal ports and saving wiring space.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. An electroluminescent display panel comprising:

a plurality of pixel circuits arranged in an array, wherein the plurality of pixel circuits each comprises a node initialization module and an anode reset module;

wherein a connection passage is arranged between every two adjacent pixel circuits of each column of the plurality of pixel circuits; and wherein the connection passage is configured to provide a reference signal to a node initialization module of one of the every two adjacent pixel circuits;

wherein the node initialization module of the each pixel circuit comprises a first terminal electrically connected with a first scan signal terminal of the each pixel circuit, a second terminal electrically connected with a reference signal terminal of the each pixel circuit, a third terminal electrically connected with a first node of the each pixel circuit, a fourth terminal electrically connected with a second node of the each pixel circuit, and a fifth terminal used for receiving a reference signal; and wherein the node initialization module of the each pixel circuit is configured to be controlled by a first scan signal input from the first scan signal terminal of the each pixel circuit to transmit a reference signal input from the reference signal terminal of the each pixel circuit to the first node of the each pixel circuit, and to transmit the reference signal received by the fifth terminal of the node initialization module to the second node of the each pixel circuit;

wherein the anode reset module of the each pixel circuit comprises a first terminal electrically connected with a second scan signal terminal of the each pixel circuit, a second terminal electrically connected with a third node of the each pixel circuit, and a third terminal used for receiving a reference signal; and wherein the anode reset module of the each pixel circuit is configured to be controlled by a second scan signal input from the second scan signal terminal of the each pixel circuit to transmit the reference signal received by the third terminal of the anode reset module to the third node of the each pixel circuit; and wherein the connection passage is configured to provide a reference signal to a fifth terminal of the node initialization module of the one of the every two adjacent pixel circuits.

2. The electroluminescent display panel according to claim 1, wherein a fifth terminal of a node initialization module of a pixel circuit other than a first pixel circuit among said column of the plurality of pixel circuits, is electrically connected with a third node of a previous pixel circuit; and wherein a fifth terminal of a node initialization module of the first pixel circuit is electrically connected with a first node of the first pixel circuit.

3. The electroluminescent display panel according to claim 2, wherein a third terminal of an anode reset module of a pixel circuit among said column of the plurality of pixel circuits is electrically connected with a reference signal terminal of the pixel circuit.

4. The electroluminescent display panel according to claim 1, wherein the node initialization module of the each pixel circuit comprises: a first switch transistor and a second switch transistor;

wherein the first switch transistor comprises a gate electrically connected with the first scan signal terminal of the each pixel circuit, a source electrically connected with the reference signal terminal of the each pixel circuit, and a drain electrically connected with the first node of the each pixel circuit; and wherein the second switch transistor comprises a gate electrically connected with the first scan signal terminal of the each pixel circuit, a drain electrically connected with the second node of the each pixel circuit, and a source used for receiving a reference signal.

5. The electroluminescent display panel according to claim 4, wherein the first switch transistor has a dual-gate structure, and comprises a first sub-switch transistor and a second sub-switch transistor;

wherein a drain of the first sub-switch transistor is electrically connected with a source of the second sub-switch transistor;

wherein a gate of the first sub-switch transistor and a gate of the second sub-switch transistor are electrically connected with the first scan signal terminal of the each pixel circuit respectively; and wherein a source of the first sub-switch transistor is electrically connected with the reference signal terminal of the each pixel circuit, and a drain of the second sub-switch transistor is electrically connected with the first node of the each pixel circuit.

6. The electroluminescent display panel according to claim 1, wherein the anode reset module of the each pixel circuit comprises: a third switch transistor;

wherein the third switch transistor comprises a gate electrically connected with the second scan signal terminal of the each pixel circuit, a drain electrically connected with the third node of the each pixel circuit, and a source used for receiving a reference signal.

7. The electroluminescent display panel according to claim 1, wherein the each pixel circuit further comprises: a data writing module, a light emitting control module, a drive control module and a light emitting diode;

wherein the data writing module comprises a first terminal electrically connected with the second scan signal terminal of the each pixel circuit, a second terminal electrically connected with a data signal terminal of the each pixel circuit, a third terminal electrically connected with the second node of the each pixel circuit, a fourth terminal electrically connected with the first node of the each pixel circuit, and a fifth terminal electrically connected with a fourth node of the each pixel circuit; and wherein the data writing module is configured to be controlled by the second scan signal input from the second scan signal terminal of the each pixel circuit to transmit a data signal input from the data signal terminal of the each pixel circuit to the second node of the each pixel circuit, and to provide an electric potential at the fourth node of the each pixel circuit to the first node of the each pixel circuit;

wherein the light emitting control module comprises a first terminal electrically connected with a light emitting control signal terminal of the each pixel circuit, a second terminal electrically connected with a first voltage signal terminal of the each pixel circuit, a third terminal electrically connected with the second node of the each pixel circuit, a fourth terminal electrically connected with the fourth node of the each pixel circuit, and a fifth terminal electrically connected with the third node of the each pixel circuit; and the light emitting control module is configured to be controlled by a light emitting control signal input from the light emitting control signal terminal of the each pixel circuit to transmit a first voltage signal input from the first voltage signal terminal of the each pixel circuit to the second node of the each pixel circuit, and to provide the electric potential at the fourth node of the each pixel circuit to the third node of the each pixel circuit;

wherein the drive control module comprises a first terminal electrically connected with the first node of the each pixel circuit, a second terminal electrically connected with the first voltage signal terminal of the each pixel circuit, a third terminal electrically connected with the second node of the each pixel circuit, and a fourth terminal electrically connected with the fourth node of the each pixel circuit; and the drive control module is configured to be controlled by the first voltage signal input from the first voltage signal terminal of the each pixel circuit to maintain an electric potential at the first node of the each pixel circuit, and to be controlled by the first node of the each pixel circuit to connect the second node of the each pixel circuit with the fourth node of the each pixel circuit; and wherein the organic light emitting diode comprises a first terminal electrically connected with the third node of the each pixel circuit, and a second terminal electrically connected with a second voltage signal terminal of the each pixel circuit.

8. The electroluminescent display panel according to claim 7, wherein the data writing module comprises: a fourth switch transistor and a fifth switch transistor;

wherein the fourth switch transistor comprises a gate electrically connected with the second scan signal terminal of the each pixel circuit, a source electrically connected with the data signal terminal of the each pixel circuit, and a drain electrically connected with the second node of the each pixel circuit; and wherein the fifth switch transistor comprises a gate electrically connected with the second scan signal terminal of the each pixel circuit, a source electrically connected with the fourth node of the each pixel circuit, and a drain electrically connected with the first node of the each pixel circuit.

9. The electroluminescent display panel according to claim 8, wherein the fifth switch transistor has a dual-gate structure, and wherein the fifth switch transistor comprises a third sub-switch transistor and a fourth sub-switch transistor;

wherein a source of the third sub-switch transistor is electrically connected with a drain of the fourth sub-switch transistor;

wherein a gate of the third sub-switch transistor and a gate of the fourth sub-switch transistor are electrically connected with the second scan signal terminal of the each pixel circuit respectively; and wherein a drain of the third sub-switch transistor is electrically connected with the first node of the each pixel circuit, and a source of the fourth sub-switch transistor is electrically connected with the fourth node of the each pixel circuit.

10. The electroluminescent display panel according to claim 7, wherein the light emitting control module comprises a sixth switch transistor and a seventh switch transistor;

wherein the sixth switch transistor comprises a gate electrically connected with the light emitting control signal terminal of the each pixel circuit, a source electrically connected with the first voltage signal terminal of the each pixel circuit, and a drain electrically connected with the second node of the each pixel circuit; and wherein the seventh switch transistor comprises a gate electrically connected with the light emitting control signal terminal of the each pixel circuit, a source electrically connected with the fourth node of the each pixel circuit, and a drain electrically connected with the third node of the each pixel circuit.

11. The electroluminescent display panel according to claim 7, wherein the drive control module comprises a drive transistor and a capacitor;

wherein the drive transistor comprises a gate electrically connected with the first node of the each pixel circuit, a source electrically connected with the second node of the each pixel circuit, and a drain electrically connected with the fourth node of the each pixel circuit; and wherein the capacitor is connected between the first node of the each pixel circuit and the first voltage signal terminal of the each pixel circuit.

12. The electroluminescent display panel according to claim 8, wherein all switch transistors of the each pixel circuit are P-type transistors.

13. A display device, comprising the electroluminescent display panel according to claim 1.

14. A method for driving an electroluminescent display panel, wherein the electroluminescent display panel comprises a plurality of pixel circuits arranged in an array, wherein the plurality of pixel circuits each comprises a node initialization module and an anode reset module; wherein a connection passage is arranged between every two adjacent pixel circuits of each column of the plurality of pixel circuits; and wherein the node initialization module of the each pixel circuit comprises a first terminal electrically connected with a first scan signal terminal of the each pixel circuit, a second terminal electrically connected with a reference signal terminal of the each pixel circuit, a third terminal electrically connected with a first node of the each pixel circuit, a fourth terminal electrically connected with a second node of the each pixel circuit, and a fifth terminal used for receiving a reference signal; and wherein the node initialization module of the each pixel circuit is configured to be controlled by a first scan signal input from the first scan signal terminal of the each pixel circuit to transmit a reference signal input from the reference signal terminal of the each pixel circuit to the first node of the each pixel circuit, and to transmit the reference signal received by the fifth terminal of the node initialization module to the second node of the each pixel circuit;

wherein the anode reset module of the each pixel circuit comprises a first terminal electrically connected with a second scan signal terminal of the each pixel circuit, a second terminal electrically connected with a third node of the each pixel circuit, and a third terminal used for receiving a reference signal; and wherein the anode reset module of the each pixel circuit is configured to be controlled by a second scan signal input from the second scan signal terminal of the each pixel circuit to transmit the reference signal received by the third terminal of the anode reset module to the third node of the each pixel circuit; and wherein the method further comprising:

providing, by the connection passage, a fifth terminal of the node initialization module of the one of the every two adjacent pixel circuits with a reference signal, in an initialization stage of the one of the every two adjacent pixel circuits.

15. The method according to claim 14, wherein:

in an initialization stage, providing a first level signal to a first scan signal terminal of the each pixel circuit, providing a second level signal to a second scan signal terminal and a light emitting control signal terminal of the each pixel circuit;

in a data writing stage, providing the second level signal to the first scan signal terminal of the each pixel circuit, providing the first level signal to the second scan signal terminal of the each pixel circuit, and providing the second level signal to the light emitting control signal terminal of the each pixel circuit; and in a light emitting stage, providing the second level signal to the first scan signal terminal of the each pixel circuit, providing the second level signal to the second scan signal terminal of the each pixel circuit, and providing the first level signal to the light emitting control signal terminal of the each pixel circuit.

16. The electroluminescent display panel according to claim 1, wherein a fifth terminal of a node initialization module of a pixel circuit other than a first pixel circuit among said column of the plurality of pixel circuits, is electrically connected with a third node of a previous pixel circuit; and wherein a fifth terminal of a node initialization module of the first pixel circuit is electrically connected with a reference signal terminal of the first pixel circuit.

* * * * *